(12) United States Patent
Kitazawa et al.

(10) Patent No.: US 12,550,665 B2
(45) Date of Patent: Feb. 10, 2026

(54) TEMPERATURE MEASUREMENT METHOD AND HEAT TREATMENT APPARATUS

(71) Applicant: SCREEN Holdings Co., Ltd., Kyoto (JP)

(72) Inventors: Takahiro Kitazawa, Kyoto (JP); Hikaru Kawarazaki, Kyoto (JP)

(73) Assignee: SCREEN Holdings Co., Ltd., Kyoto (JP)

( * ) Notice: Subject to any disclaimer, the term of this patent is extended or adjusted under 35 U.S.C. 154(b) by 510 days.

(21) Appl. No.: 18/074,117

(22) Filed: Dec. 2, 2022

(65) Prior Publication Data

US 2023/0274959 A1    Aug. 31, 2023

(30) Foreign Application Priority Data

Feb. 25, 2022   (JP) ................. 2022-028264

(51) Int. Cl.
 *H01L 21/67* (2006.01)
 *G01J 5/00* (2022.01)

(52) U.S. Cl.
 CPC ...... *H01L 21/67248* (2013.01); *G01J 5/0007* (2013.01); *H01L 21/67115* (2013.01)

(58) Field of Classification Search
 CPC .......... H01L 21/67248; H01L 21/67115; G01J 5/0007
 See application file for complete search history.

(56) References Cited

U.S. PATENT DOCUMENTS

| 4,881,823 A | 11/1989 | Tanaka et al. |
| 5,314,249 A | 5/1994 | Marui et al. |

(Continued)

FOREIGN PATENT DOCUMENTS

| CN | 108981923 A | 12/2018 |
| CN | 112420498 A | 2/2021 |

(Continued)

OTHER PUBLICATIONS

Office Action and Search Report dated Apr. 30, 2024 in corresponding Taiwanese Patent Application No. 112103594 and English translation made from the Japanese translation of the original communication.

(Continued)

*Primary Examiner* — Peter J Macchiarolo
*Assistant Examiner* — Mireille S Sadate-Moualeu
(74) *Attorney, Agent, or Firm* — OSTROLENK FABER LLP

(57) ABSTRACT

A temperature measurement method includes: a radiation temperature measurement step for detecting a brightness temperature of a semiconductor wafer from obliquely below the semiconductor wafer; an input parameter calculation step for calculating at least two input parameters from the brightness temperature detected in the radiation temperature measurement step, the at least two input parameters including a first input parameter corresponding to an emissivity ratio of the semiconductor wafer and a second input parameter corresponding to a temperature of the semiconductor wafer; an output parameter estimation step for estimating an output parameter from the first input parameter and the second input parameter; and a temperature calculation step for calculating the temperature of the semiconductor wafer from the output parameter estimated in the output parameter estimation step and the brightness temperature detected in the radiation temperature measurement step.

8 Claims, 18 Drawing Sheets

(56) References Cited

U.S. PATENT DOCUMENTS

| | | | |
|---|---|---|---|
| 2017/0178979 A1* | 6/2017 | Furukawa | ............ H05B 1/0233 |
| 2018/0077754 A1 | 3/2018 | Ito | |
| 2019/0393054 A1 | 12/2019 | Ono | |
| 2021/0057245 A1 | 2/2021 | Ueno et al. | |
| 2021/0272827 A1* | 9/2021 | Nakajima | ............... F27D 21/04 |
| 2021/0366745 A1 | 11/2021 | Furukawa et al. | |

FOREIGN PATENT DOCUMENTS

| | | |
|---|---|---|
| JP | H02-85730 A | 3/1990 |
| JP | H05-215610 A | 8/1993 |
| JP | H07-146179 A | 6/1995 |
| JP | 2018-046130 A | 3/2018 |
| JP | 2019-168307 A | 10/2019 |
| KR | 100399632 B1 | 9/2003 |
| KR | 10-2019-0143389 A | 12/2019 |
| KR | 10-2021-0023748 A | 3/2021 |
| KR | 10-2021-0143123 A | 11/2021 |
| TW | 201724266 A | 7/2017 |
| TW | 202123341 A | 6/2021 |

OTHER PUBLICATIONS

Notice of Reasons for Refusal dated Jul. 1, 2025 in corresponding Japanese Patent Application No. 2022-028264 with English language translation.

Decision of Grant dated May 16, 2025 in corresponding Korean Patent Application No. 10-2023-0018491.

* cited by examiner

TEMPERATURE MEASUREMENT METHOD AND HEAT TREATMENT APPARATUS

BACKGROUND OF THE INVENTION

Field of the Invention

The present invention relates to a temperature measurement method which measures the temperature of a thin plate-like precision electronic substrate (hereinafter referred to simply as a "substrate") such as a semiconductor wafer heated by irradiation with light, and a heat treatment apparatus which irradiates a substrate with light to heat the substrate.

Description of the Background Art

In the process of manufacturing a semiconductor device, attention has been given to flash lamp annealing (FLA) which heats a semiconductor wafer in an extremely short time. The flash lamp annealing is a heat treatment technique in which xenon flash lamps (the term "flash lamp" as used hereinafter refers to a "xenon flash lamp") are used to irradiate a surface of a semiconductor wafer with a flash of light, thereby raising the temperature of only the surface of the semiconductor wafer in an extremely short time (several milliseconds or less).

The xenon flash lamps have a spectral distribution of radiation ranging from ultraviolet to near-infrared regions. The wavelength of light emitted from the xenon flash lamps is shorter than that of light emitted from conventional halogen lamps, and approximately coincides with a fundamental absorption band of a silicon semiconductor wafer. Thus, when a semiconductor wafer is irradiated with a flash of light emitted from the xenon flash lamps, the temperature of the semiconductor wafer can be raised rapidly, with only a small amount of light transmitted through the semiconductor wafer. Also, it has turned out that flash irradiation, that is, the irradiation of a semiconductor wafer with a flash of light in an extremely short time of several milliseconds or less allows a selective temperature rise only near the surface of the semiconductor wafer.

Such flash lamp annealing is used for processes that require heating in an extremely short time, e.g. typically for the activation of impurities implanted in a semiconductor wafer. The irradiation of the surface of the semiconductor wafer implanted with impurities by an ion implantation process with a flash of light emitted from the flash lamps allows the temperature rise only in the surface of the semiconductor wafer to a temperature at which the impurities are activated for an extremely short time. This achieves only the activation of the impurities without deep diffusion of the impurities in the semiconductor wafer.

Not only in the flash lamp annealing but also in the heat treatment of a semiconductor wafer, it is important to control the temperature of the wafer. In the flash lamp annealing as well, an important process control indicator is whether the maximum attained temperature of the surface of the semiconductor wafer at the time of the irradiation with a flash of light and the temperature of portions other than the surface of the semiconductor wafer are correctly processed or not. For this reason, non-contact radiation thermometers, in general, have been used to measure the temperature of semiconductor wafers. The emissivity of an object to be measured is essential for temperature measurement with a radiation thermometer. Conventionally, a predetermined emissivity is set, and the temperature of a semiconductor wafer is measured.

Unfortunately, it is known that silicon, which is employed as a material of semiconductor wafers, changes its infrared transmittance depending on temperature. Such changes in infrared transmittance cause variations in infrared emissivity. In addition, recent semiconductor technology has tended to stack various thin films in multiple layers (e.g., 100 or more layers) with the progress of three-dimensional densification. It is also known that the stacking of thin films in multiple layers causes significant variations in emissivity.

Japanese Patent Application Laid-Open No. 5-215610 (1993) discloses an apparatus capable of estimating a temperature close to an actually measured value even when the physical properties of a surface of a material are changed. Specifically, the apparatus disclosed in Japanese Patent Application Laid-Open No. 5-215610 (1993) detects light of a predetermined wavelength emitted from a material to output a detection signal; determines a first parameter corresponding to an emissivity ratio from the outputted detection signal; and determines a second parameter based on a correlation between the first parameter and the second parameter corresponding to a physical property value of the state of the material surface.

However, silicon, for example, has the property of changing in color depending on temperature as mentioned above, and the change in color resulting from a change in temperature causes a change in emissivity. When the temperature of the surface of such a material is measured, there are cases in which even the apparatus disclosed in Japanese Patent Application Laid-Open No. 5-215610 (1993) shows a large discrepancy between the measured temperature and the actual temperature. On the other hand, recent demands for ever-higher precision of semiconductor wafers have made it necessary to maintain portions other than the surface of semiconductor wafers at a temperature low enough to prevent impurities from diffusing while maintaining the surface of the semiconductor wafers at a temperature high enough to activate impurities. This has required more precise temperature control of semiconductor wafers than ever before. Thus, a technique for further eliminating such discrepancies between the measured temperature and the actual temperature has been expected.

SUMMARY

The present invention is intended for a method of measuring a temperature of a substrate heated by irradiation with light, and a heat treatment apparatus for irradiating a substrate with light to heat the substrate.

According to one aspect of the present invention, the method comprises the steps of: (a) detecting at least one brightness temperature of the substrate from obliquely above or obliquely below the substrate; (b) calculating at least two input parameters from the brightness temperature detected in the step (a), the at least two input parameters including a first input parameter corresponding to a ratio between emissivities of the substrate and a second input parameter corresponding to a temperature of the substrate; (c) estimating an output parameter from the first input parameter and the second input parameter; and (d) calculating the temperature of the substrate from the output parameter estimated in the step (c) and the brightness temperature detected in the step (a).

This method includes the step (b) of calculating the at least two input parameters, i.e. the first input parameter corresponding to the ratio between the emissivities of the substrate and the second input parameter corresponding to the temperature of the substrate, from the brightness temperature detected in the step (a). Therefore, the method is capable of accurately measuring the temperature of the substrate.

According to another aspect of the present invention, the heat treatment apparatus comprises: a chamber for receiving the substrate therein; a susceptor for placing and holding the substrate thereon within the chamber; at least one radiation thermometer provided obliquely above or obliquely below the susceptor and for detecting a brightness temperature of the substrate; an input parameter calculation part for calculating at least two input parameters from the brightness temperature detected by the radiation thermometer, the at least two input parameters including a first input parameter corresponding to an emissivity ratio of the substrate and a second input parameter corresponding to a temperature of the substrate; an output parameter estimation part for estimating an output parameter from the first input parameter and the second input parameter; and a temperature calculation part for calculating the temperature of the substrate from the output parameter estimated by the output parameter estimation part and the brightness temperature detected by the radiation thermometer.

The heat treatment apparatus includes the input parameter calculation part for calculating the at least two input parameters, i.e. the first input parameter corresponding to the emissivity ratio of the substrate and the second input parameter corresponding to the temperature of the substrate, from the brightness temperature detected by the radiation thermometer. Therefore, the heat treatment apparatus is capable of accurately measuring the temperature of the substrate.

It is therefore an object of the present invention to provide a temperature measurement method and a heat treatment apparatus which accurately measure the temperature of a substrate.

These and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
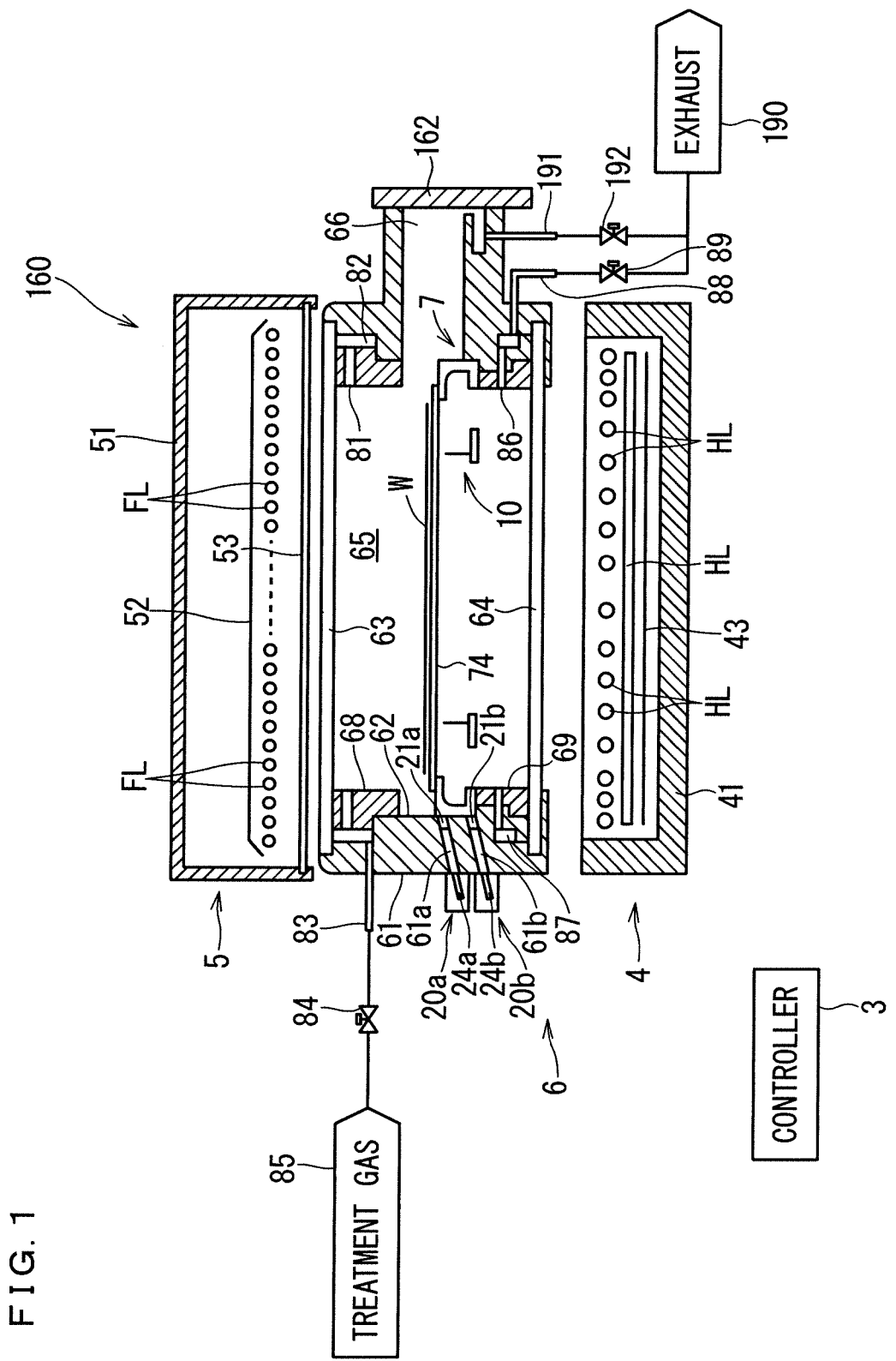
FIG. 1 is a sectional view schematically showing a configuration of a heat treatment apparatus according to a first preferred embodiment.

Preferred embodiments will now be described with reference to the accompanying drawings. In the following preferred embodiments, detailed features and the like are shown for the purpose of illustrating the technique, but are illustrative. Not all of the detailed features are necessarily essential to make the preferred embodiment feasible.

In the drawings, figures show schematic representations, and components are not shown or shown in simplified form, as appropriate, for convenience of illustration. The sizes and positions of components shown in different figures are not necessarily in a correct correlation, but may be changed, as appropriate. In figures that are plan views or the like rather than sectional views, components are in some cases hatched or shaded for the purpose of facilitating the understanding of the details of the preferred embodiments.

In the following description, similar components are designated by and shown using the same reference numerals and characters, and shall have similar designations and functions. Thus, these components will not be described in detail in some cases for the purpose of avoiding repetition in description.

In the following description, the expression "comprising", "including", or "having" a component is not an exclusive expression that excludes the presence of other components, unless otherwise specified.

In the case where ordinal numerals such as "first", "second", or the like are used in the following description, these terms shall be used for the sake of convenience and for the purpose of facilitating the understanding of the details of the preferred embodiments, and shall not be limited to the order caused by the ordinal numerals.

In the following description, expressions indicating relative or absolute positional relationships, such as "in one direction", "along one direction", "parallel", "orthogonal", "center", "concentric", or "coaxial", shall include cases in which the positional relationships are strictly indicated and cases in which the angle or distance is displaced to the extent that tolerances or similar functions are obtained, unless otherwise specified.

In the following description, expressions indicating equal states, such as "identical", "equal", "uniform", or "homogeneous", shall include cases in which the expressions indicate strictly equal states and cases in which differences occur to the extent that tolerances or similar functions are obtained, unless otherwise specified.

Terms that mean specific positions or directions such as "upper", "lower", "left", "right", "side", "bottom", "front", or "back" in the following description, if any, shall be used for the sake of convenience and for the purpose of facilitating the understanding of the details of the preferred embodiments, and shall not be related to positions or directions used during actual implementation.

The expression "upper face of" or "lower face of" a first component used in the following description is to be interpreted as including a situation in which a second component is formed on the upper or lower face of the first component in addition to meaning the upper or lower face itself of the first component. That is, the expression "a first component provided on an upper face of a second component" used as an example shall not preclude the presence of a third component interposed between the first and second components.

First Preferred Embodiment

A heat treatment apparatus and a temperature measurement method according to a first preferred embodiment will be described.

FIG. 1 is a sectional view schematically showing a configuration of a heat treatment apparatus 160 according to the present preferred embodiment.

As an example is shown in FIG. 1, the heat treatment apparatus 160 of the present preferred embodiment is a flash lamp annealer for irradiating a disk-shaped semiconductor wafer W serving as a substrate with flashes of light to heat the semiconductor wafer W.

The size of the semiconductor wafer W to be treated is not particularly limited. For example, the semiconductor wafer W to be treated has a diameter of 300 mm or 450 mm (in the present preferred embodiment, 300 mm).

The heat treatment apparatus 160 includes a chamber 6 for receiving a semiconductor wafer W therein, a flash heating part 5 including a plurality of built-in flash lamps FL, and a halogen heating part 4 including a plurality of built-in halogen lamps HL. The flash heating part 5 is provided over the chamber 6, and the halogen heating part 4 is provided under the chamber 6. In the present preferred embodiment, the halogen heating part 4 includes the halogen lamps HL. However, the halogen heating part 4 may include arc lamps or LEDs (Light-Emitting Diodes) in place of the halogen lamps HL. With the aforementioned configuration, the semiconductor wafer W is heated while being received in the chamber 6.

The flash lamps FL irradiates a semiconductor wafer W with flashes of light to thereby heat the semiconductor wafer W. The halogen lamps HL continuously heat the semiconductor wafer W.

The heat treatment apparatus 160 further includes a holder 7 provided inside the chamber 6 and for holding a semiconductor wafer W in a horizontal attitude, and a transfer mechanism 10 provided inside the chamber 6 and for transferring a semiconductor wafer W between the holder 7 and the outside of the heat treatment apparatus 160.

The heat treatment apparatus 160 further includes a controller 3 for controlling operating mechanisms provided in the halogen heating part 4, the flash heating part 5, and the chamber 6 to cause the operating mechanisms to heat-treat a semiconductor wafer W.

The chamber 6 is closed by an upper chamber window 63 made of quartz and mounted on an upper surface of a chamber housing 61.

The upper chamber window 63 forming the ceiling of the chamber 6 is a disk-shaped member made of quartz, and serves as a quartz window that transmits light emitted from the flash heating part 5 therethrough into the chamber 6.

A lower chamber window 64 forming the floor of the chamber 6 is also a disk-shaped member made of quartz, and serves as a quartz window that transmits light emitted from the halogen heating part 4 therethrough into the chamber 6.

An upper reflective ring 68 is mounted to an upper portion of the inner wall surface of the chamber housing 61, and a lower reflective ring 69 is mounted to a lower portion thereof. Both the upper reflective ring 68 and the lower reflective ring 69 are in the form of an annular ring.

The upper reflective ring 68 is mounted by being inserted downwardly from the top of the chamber housing 61. The lower reflective ring 69, on the other hand, is mounted by being inserted upwardly from the bottom of the chamber housing 61 and fastened with screws not shown. In other words, the upper reflective ring 68 and the lower reflective ring 69 are removably mounted to the chamber housing 61.

An interior space of the chamber 6, i.e. a space surrounded by the upper chamber window 63, the chamber housing 61, and the upper reflective ring 68, is defined as a heat treatment space 65.

A recessed portion 62 is defined in the inner wall surface of the chamber 6 by mounting the upper reflective ring 68 and the lower reflective ring 69 to the chamber housing 61. Specifically, the recessed portion 62 is defined which is surrounded by a middle portion of the inner wall surface of the chamber housing 61 where the upper reflective ring 68 and the lower reflective ring 69 are not mounted, a lower end surface of the upper reflective ring 68, and an upper end surface of the lower reflective ring 69.

The recessed portion 62 is provided in the form of a horizontal annular ring in the inner wall surface of the chamber 6, and surrounds the holder 7 which holds a semiconductor wafer W. The chamber housing 61, the upper reflective ring 68, and the lower reflective ring 69 are made of a metal material (e.g., stainless steel) with high strength and high heat resistance.

The chamber housing 61 is provided with a transport opening (throat) 66 for the transport of a semiconductor wafer W therethrough into and out of the chamber 6. The transport opening 66 is openable and closable by a gate valve 162. The transport opening 66 is connected in communication with an outer peripheral surface of the recessed portion 62.

Thus, when the transport opening 66 is opened by the gate valve 162, a semiconductor wafer W is allowed to be transported through the transport opening 66 and the recessed portion 62 into and out of the heat treatment space 65. When the transport opening 66 is closed by the gate valve 162, the heat treatment space 65 in the chamber 6 is an enclosed space.

The chamber housing 61 is further provided with a through hole 61a and a through hole 61b both bored therein. A first radiation thermometer 20a and a second radiation thermometer 20b are attached to locations where the through hole 61a and the through hole 61b, respectively, are provided. The through hole 61a is a cylindrical hole for directing infrared light emitted from a lower surface (back surface) of a semiconductor wafer W held by a susceptor 74 to be described later therethrough to an infrared sensor 24a of the first radiation thermometer 20a. The through hole 61b is a cylindrical hole for directing infrared light emitted from the lower surface (back surface) of the semiconductor wafer W therethrough to an infrared sensor 24b of the second radiation thermometer 20b. The through holes 61a and 61b are inclined with respect to a horizontal direction so that the longitudinal axes (axes extending in respective directions in which the through holes 61a and 61b extend through the chamber housing 61) of the respective through holes 61a and 61b intersect main surfaces of the semiconductor wafer W held by the susceptor 74.

Examples of the infrared sensors 24a and 24b include: thermal infrared sensors such as pyroelectric sensors that use a pyroelectric effect, thermopiles that use a Seebeck effect, and bolometers that use a change in resistance of a semiconductor due to heat; and quantum infrared sensors.

Each of the infrared sensor 24a and the infrared sensor 24b has an optical axis inclined with respect to a main surface (front surface) of the semiconductor wafer W held by the susceptor 74, and receives infrared light emitted from the lower surface (back surface) of the semiconductor wafer W.

A transparent window 21a made of barium fluoride material transparent to infrared light in a wavelength range measurable with the first radiation thermometer 20a is mounted to an end portion of the through hole 61a which faces the heat treatment space 65. Similarly, a transparent window 21b made of barium fluoride material transparent to infrared light in a wavelength range measurable with the second radiation thermometer 20b is mounted to an end portion of the through hole 61b which faces the heat treatment space 65. The transparent window 21a and the transparent window 21b may be made of quartz, for example.

At least one gas supply opening 81 for supplying a treatment gas therethrough into the heat treatment space 65 is provided in an upper portion of the inner wall of the chamber 6. The gas supply opening 81 is provided above the recessed portion 62, and may be provided in the upper reflective ring 68. The gas supply opening 81 is connected in communication with a gas supply pipe 83 through a buffer space 82 provided in the form of an annular ring inside the side wall of the chamber 6.

The gas supply pipe 83 is connected to a treatment gas supply source 85. A valve 84 is interposed in the gas supply pipe 83. When the valve 84 is opened, the treatment gas is fed from the treatment gas supply source 85 to the buffer space 82.

The treatment gas flowing in the buffer space 82 flows in a spreading manner within the buffer space 82 which is lower in fluid resistance than the gas supply opening 81, and is supplied through the gas supply opening 81 into the heat treatment space 65. Examples of the treatment gas usable herein include inert gases such as nitrogen gas ($N_2$), reactive gases such as hydrogen ($H_2$) and ammonia ($NH_3$), and mixtures of these gases (although nitrogen gas is used in the present preferred embodiment).

At least one gas exhaust opening 86 for exhausting a gas from the heat treatment space 65 is provided in a lower portion of the inner wall of the chamber 6. The gas exhaust opening 86 is provided below the recessed portion 62, and may be provided in the lower reflective ring 69. The gas exhaust opening 86 is connected in communication with a gas exhaust pipe 88 through a buffer space 87 provided in the form of an annular ring inside the side wall of the chamber 6. The gas exhaust pipe 88 is connected to an exhaust part 190. A valve 89 is interposed in the gas exhaust pipe 88. When the valve 89 is opened, the gas in the heat treatment space 65 is exhausted through the gas exhaust opening 86 and the buffer space 87 to the gas exhaust pipe 88.

The at least one gas supply opening 81 and the at least one gas exhaust opening 86 may include a plurality of gas supply openings 81 and a plurality of gas exhaust openings 86, respectively, arranged in a circumferential direction of the chamber 6, and may be in the form of slits. The treatment gas supply source 85 and the exhaust part 190 may be mechanisms provided in the heat treatment apparatus 160 or be utility systems in a factory in which the heat treatment apparatus 160 is installed.

A gas exhaust pipe 191 for exhausting the gas from the heat treatment space 65 is also connected to a distal end of the transport opening 66. The gas exhaust pipe 191 is connected through a valve 192 to the exhaust part 190. By opening the valve 192, the gas in the chamber 6 is exhausted through the transport opening 66.

Figure 2:
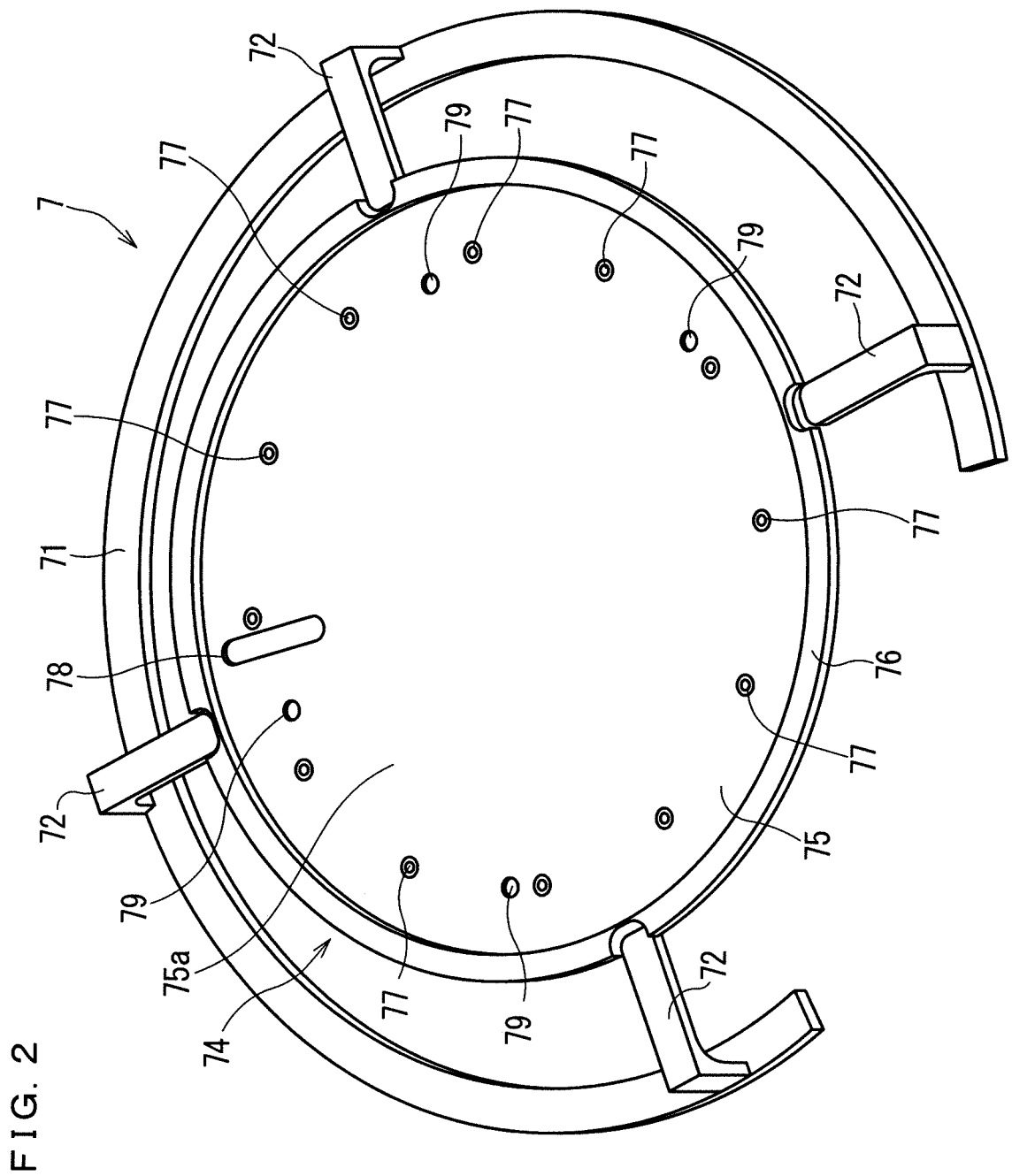
FIG. 2 is a perspective view showing the entire external appearance of a holder.

FIG. 2 is a perspective view showing the entire external appearance of the holder 7. The holder 7 includes a base ring 71, coupling portions 72, and the susceptor 74. The base ring 71, the coupling portions 72, and the susceptor 74 are all made of quartz. In other words, the whole of the holder 7 is made of quartz.

The base ring 71 is a quartz member having an arcuate shape obtained by removing a portion from an annular shape. This removed portion is provided to prevent interference between transfer arms 11 of the transfer mechanism 10 to be described later and the base ring 71. The base ring 71 is supported by the wall surface of the chamber 6 by being placed on the bottom surface of the recessed portion 62 (with reference to FIG. 3). The multiple coupling portions 72 (in the present preferred embodiment, four coupling portions 72) are mounted upright on the upper surface of the base ring 71 and arranged in a circumferential direction of the annular shape thereof. The coupling portions 72 are quartz members, and are rigidly secured to the base ring 71 by welding.

Figure 3:
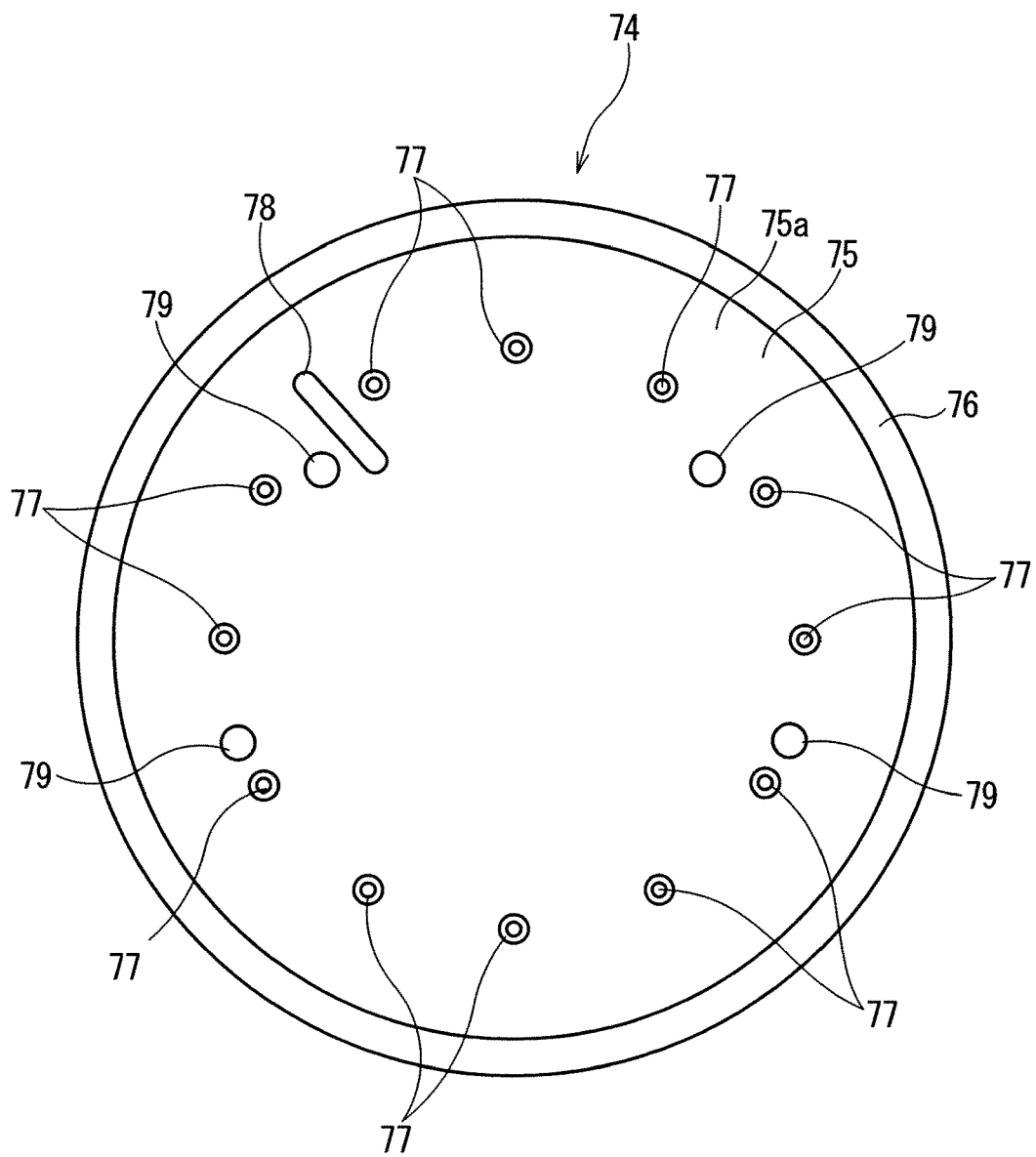
FIG. 3 is a plan view of a susceptor.
Figure 4:
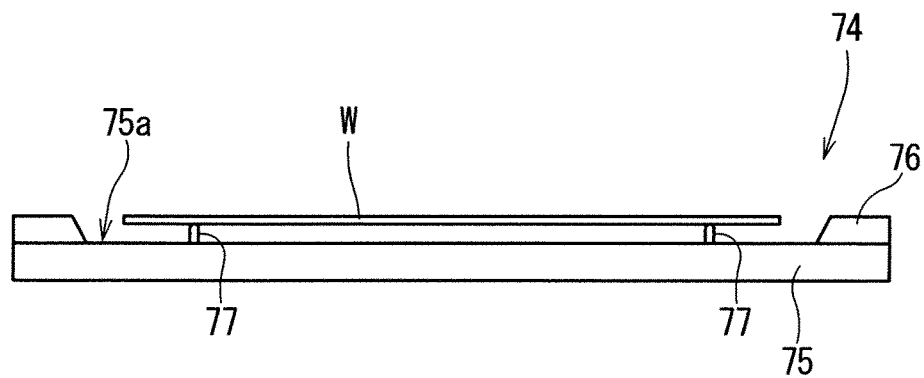
FIG. 4 is a sectional view of the susceptor.

The susceptor 74 is supported from below by the four coupling portions 72 provided on the base ring 71. FIG. 3 is a plan view of the susceptor 74. FIG. 4 is a sectional view of the susceptor 74.

The susceptor 74 includes a holding plate 75, a guide ring 76, and a plurality of support pins 77. The holding plate 75 is a generally circular planar member made of quartz. The diameter of the holding plate 75 is greater than that of a semiconductor wafer W. In other words, the holding plate 75 has a size, as seen in plan view, greater than that of the semiconductor wafer W.

The guide ring 76 is provided on a peripheral portion of the upper surface of the holding plate 75. The guide ring 76 is an annular member having an inner diameter greater than the diameter of the semiconductor wafer W. For example, when the diameter of the semiconductor wafer W is 300 mm, the inner diameter of the guide ring 76 is 320 mm.

The inner periphery of the guide ring 76 is in the form of a tapered surface which becomes wider in an upward direction from the holding plate 75. The guide ring 76 is made of quartz similar to that of the holding plate 75.

The guide ring 76 may be welded to the upper surface of the holding plate 75 or fixed to the holding plate 75 with separately machined pins and the like. Alternatively, the holding plate 75 and the guide ring 76 may be machined as an integral member.

A region of the upper surface of the holding plate 75 which is inside the guide ring 76 serves as a planar holding surface 75a for holding the semiconductor wafer W. The support pins 77 are provided on the holding surface 75a of the holding plate 75. In the present preferred embodiment, a total of 12 support pins 77 spaced at intervals of 30 degrees along the circumference of a circle concentric with the outer circumference of the holding surface 75a (the inner circumference of the guide ring 76) are provided upright in an annular form.

The diameter of the circle on which the 12 support pins 77 are disposed (the distance between opposed ones of the support pins 77) is smaller than the diameter of the semiconductor wafer W, and is 210 to 280 mm when the diameter of the semiconductor wafer W is 300 mm. At least three support pins 77 are provided. Each of the support pins 77 is made of quartz.

The support pins 77 may be provided by welding on the upper surface of the holding plate 75 or machined integrally with the holding plate 75.

Referring again to FIG. 2, the four coupling portions 72 provided upright on the base ring 71 and the peripheral portion of the holding plate 75 of the susceptor 74 are rigidly secured to each other by welding. In other words, the susceptor 74 and the base ring 71 are fixedly coupled to each other with the coupling portions 72. The base ring 71 of such a holder 7 is supported by the wall surface of the chamber 6, whereby the holder 7 is mounted to the chamber 6. With the holder 7 mounted to the chamber 6, the holding plate 75 of the susceptor 74 assumes a horizontal attitude (an attitude such that the normal to the holding plate 75 coincides with a vertical direction). In other words, the holding surface 75a of the holding plate 75 becomes a horizontal surface.

A semiconductor wafer W transported into the chamber 6 is placed and held in a horizontal attitude on the upper side of the susceptor 74 of the holder 7 mounted to the chamber 6. At this time, the semiconductor wafer W is supported by the 12 support pins 77 provided upright on the holding plate 75, and is supported by the susceptor 74 from below. More strictly speaking, the 12 support pins 77 have respective upper end portions coming in contact with the lower surface (back surface) of the semiconductor wafer W to support the semiconductor wafer W.

The semiconductor wafer W is supported in a horizontal attitude by the 12 support pins 77 because the 12 support pins 77 have a uniform height (distance from the upper ends of the support pins 77 to the holding surface 75a of the holding plate 75).

The semiconductor wafer W supported by the support pins 77 is spaced a predetermined distance apart from the holding surface 75a of the holding plate 75. The thickness of the guide ring 76 is greater than the height of the support pins 77. Thus, the guide ring 76 prevents the horizontal misregistration of the semiconductor wafer W supported by the support pins 77.

As shown in FIGS. 2 and 3, an opening 78 is provided in the holding plate 75 of the susceptor 74 so as to extend vertically through the holding plate 75 of the susceptor 74. The opening 78 is provided for the first radiation thermometer 20a and the second radiation thermometer 20b to receive radiation (infrared light) emitted from the lower surface (back surface) of the semiconductor wafer W. Specifically, the first radiation thermometer 20a and the second radiation thermometer 20b receive the radiation emitted from the lower surface (back surface) of the semiconductor wafer W through the opening 78 and through the transparent window 21a (mounted to the through hole 61a) and the transparent window 21b (mounted to the through hole 61b) of the chamber housing 61 to measure the temperature of the semiconductor wafer W.

Further, the holding plate 75 of the susceptor 74 further includes four through holes 79 bored therein and designed so that lift pins 12 of the transfer mechanism 10 to be described later pass through the through holes 79, respectively, to transfer a semiconductor wafer W.

Figure 5:
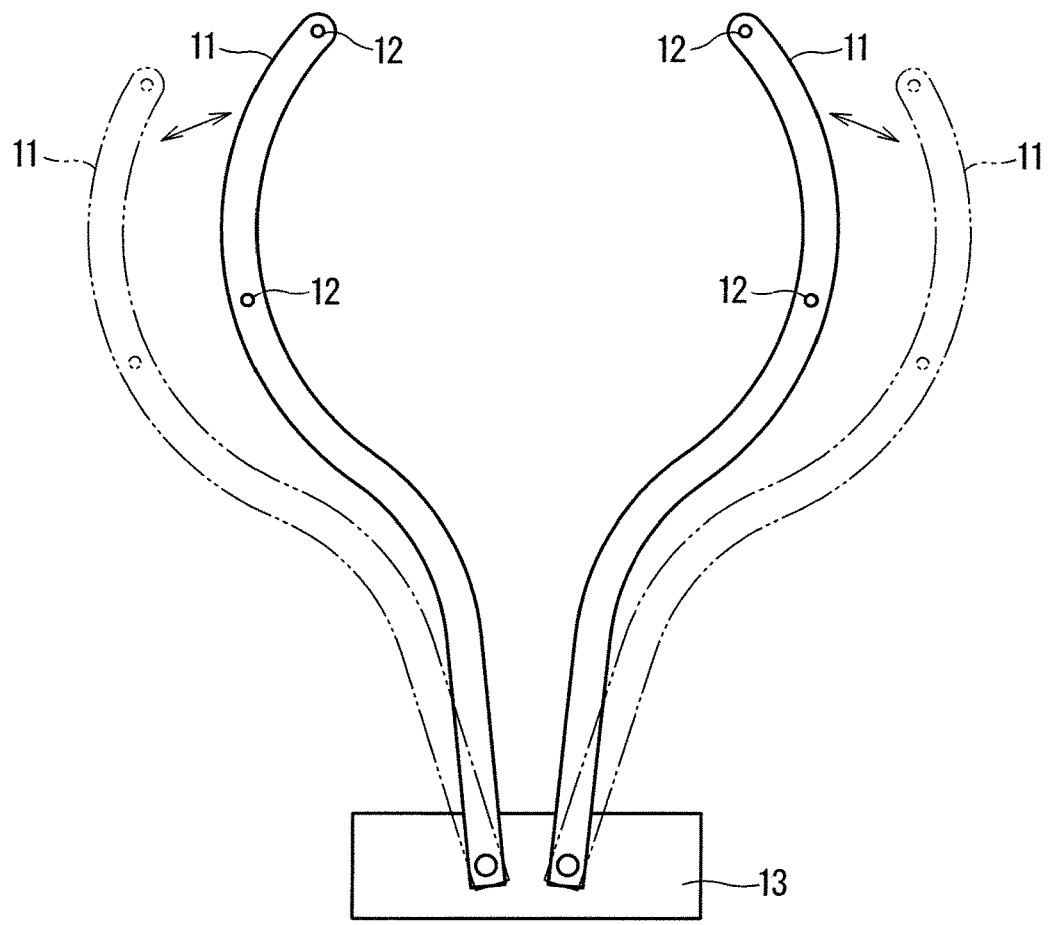
FIG. 5 is a plan view of a transfer mechanism.
Figure 6:
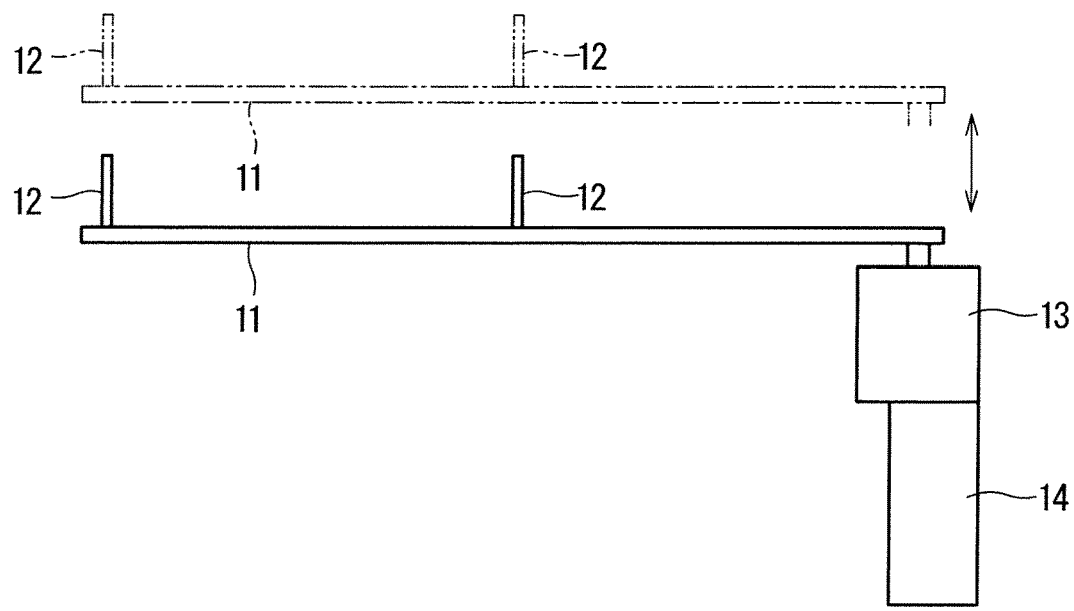
FIG. 6 is a side view of the transfer mechanism.

FIG. 5 is a plan view of the transfer mechanism 10. FIG. 6 is a side view of the transfer mechanism 10. The transfer mechanism 10 includes the two transfer arms 11. The transfer arms 11 are of an arcuate configuration extending substantially along the annular recessed portion 62.

Each of the transfer arms 11 includes the two lift pins 12 mounted upright thereon. The transfer arms 11 and the lift pins 12 are made of quartz. The transfer arms 11 are pivotable by a horizontal movement mechanism 13. The horizontal movement mechanism 13 moves the pair of transfer arms 11 horizontally between a transfer operation position (a position indicated by solid lines in FIG. 5) in which a semiconductor wafer W is transferred to and from the holder 7 and a retracted position (a position indicated by dash-double-dot lines in FIG. 5) in which the transfer arms 11 do not overlap the semiconductor wafer W held by the holder 7 as seen in plan view.

The horizontal movement mechanism 13 may be of the type which causes individual motors to pivot the transfer arms 11 respectively or of the type which uses a linkage mechanism to cause a single motor to pivot the pair of transfer arms 11 in cooperative relation.

The transfer arms 11 are moved upwardly and downwardly together with the horizontal movement mechanism 13 by an elevating mechanism 14. As the elevating mechanism 14 moves up the pair of transfer arms 11 in their transfer operation position, the four lift pins 12 in total pass through the respective four through holes 79 (with reference to FIGS. 2 and 3) bored in the susceptor 74, so that the upper ends of the lift pins 12 protrude from the upper surface of the susceptor 74. On the other hand, as the elevating mechanism 14 moves down the pair of transfer arms 11 in their transfer operation position to take the lift pins 12 out of the respective through holes 79 and the horizontal movement mechanism 13 moves the pair of transfer arms 11 so as to open the transfer arms 11, the transfer arms 11 move to their retracted position.

The retracted position of the pair of transfer arms 11 is immediately over the base ring 71 of the holder 7. The retracted position of the transfer arms 11 is inside the recessed portion 62 because the base ring 71 is placed on the bottom surface of the recessed portion 62. An exhaust mechanism not shown is also provided near the location where the drivers (the horizontal movement mechanism 13 and the elevating mechanism 14) of the transfer mechanism 10 are provided, and is configured to exhaust an atmosphere around the drivers of the transfer mechanism 10 to the outside of the chamber 6.

Referring again to FIG. 1, the flash heating part 5 provided over the chamber 6 includes an enclosure 51, a light source provided inside the enclosure 51 and including the multiple (in the present preferred embodiment, 30) xenon flash lamps FL, and a reflector 52 provided inside the enclosure 51 so as to cover the light source from above.

The flash heating part 5 further includes a lamp light radiation window 53 mounted to the bottom of the enclosure 51. The lamp light radiation window 53 forming the floor of the flash heating part 5 is a plate-like quartz window made of quartz. The flash heating part 5 is provided over the chamber 6, whereby the lamp light radiation window 53 is opposed to the upper chamber window 63. The flash lamps FL direct flashes of light from over the chamber 6 through the lamp light radiation window 53 and the upper chamber window 63 toward the heat treatment space 65.

The flash lamps FL, each of which is a rod-shaped lamp having an elongated cylindrical shape, are arranged in a plane so that the longitudinal directions of the respective flash lamps FL are in parallel with each other along a main surface (front surface) of a semiconductor wafer W held by the holder 7 (that is, in a horizontal direction). Thus, a plane defined by the arrangement of the flash lamps FL is also a horizontal plane.

Each of the flash lamps FL includes a rod-shaped glass tube (discharge tube) containing xenon gas sealed therein and having positive and negative electrodes provided on opposite ends thereof and connected to a capacitor, and a trigger electrode attached to the outer peripheral surface of the glass tube.

Because the xenon gas is electrically insulative, no current flows in the glass tube in a normal state even if electrical charge is stored in the capacitor. However, if a high voltage is applied to the trigger electrode to produce an electrical breakdown, electricity stored in the capacitor flows momentarily in the glass tube, and xenon atoms or molecules are excited at this time to cause light emission.

Such a flash lamp FL has the property of being capable of emitting extremely intense light as compared with a light source that stays lit continuously such as a halogen lamp HL because the electrostatic energy previously stored in the capacitor is converted into an ultrashort light pulse ranging from 0.1 to 100 milliseconds. Thus, the flash lamps FL are pulsed light emitting lamps which emit light instantaneously for an extremely short time period of less than one second.

The light emission time of the flash lamps FL is adjustable by the coil constant of a lamp light source which supplies power to the flash lamps FL.

The reflector 52 is provided over the plurality of flash lamps FL so as to cover all of the flash lamps FL. A fundamental function of the reflector 52 is to reflect flashes of light emitted from the plurality of flash lamps FL toward the heat treatment space 65. The reflector 52 is a plate made of an aluminum alloy. An upper surface of the reflector 52 (a surface which faces the flash lamps FL) is roughened by abrasive blasting.

The halogen heating part 4 provided under the chamber 6 includes an enclosure 41 incorporating the multiple (in the present preferred embodiment, 40) halogen lamps HL. The halogen heating part 4 directs light from under the chamber 6 through the lower chamber window 64 toward the heat treatment space 65 to heat the semiconductor wafer W by means of the halogen lamps HL.

Figure 7:
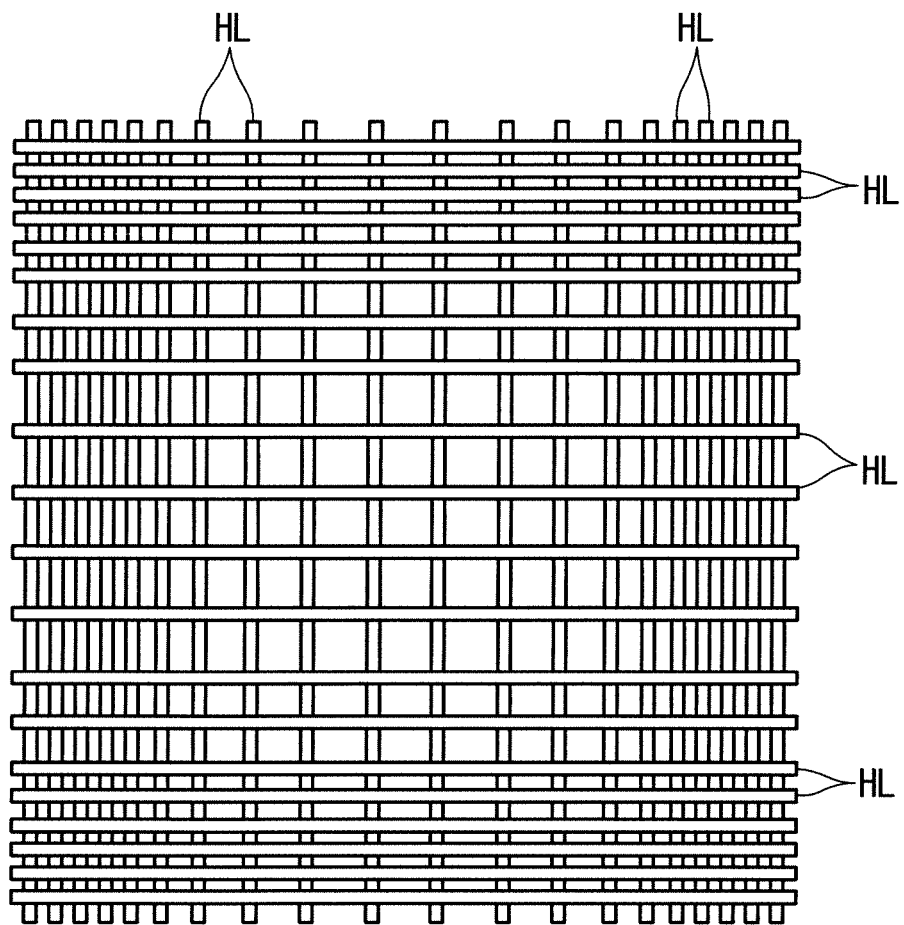
FIG. 7 is a plan view showing an arrangement of halogen lamps in a halogen heating part.

FIG. 7 is a plan view showing an arrangement of the multiple halogen lamps HL in the halogen heating part 4. The 40 halogen lamps HL are arranged in two tiers, i.e. upper and lower tiers. That is, 20 halogen lamps HL are arranged in the upper tier closer to the holder 7, and 20 halogen lamps HL are arranged in the lower tier farther from the holder 7 than the upper tier.

Each of the halogen lamps HL is a rod-shaped lamp having an elongated cylindrical shape. The 20 halogen lamps HL in each of the upper and lower tiers are arranged so that the longitudinal directions thereof are in parallel with each other along a main surface (front surface) of a semiconductor wafer W held by the holder 7 (that is, in a horizontal direction). Thus, a plane defined by the arrangement of the halogen lamps HL in each of the upper and lower tiers is also a horizontal plane.

As shown in FIG. 7, the halogen lamps HL in each of the upper and lower tiers are disposed at a higher density in a region opposed to a peripheral portion of the semiconductor wafer W held by the holder 7 than in a region opposed to a central portion thereof. In other words, the halogen lamps HL in each of the upper and lower tiers are arranged at shorter intervals in a peripheral portion of the lamp arrangement than in a central portion thereof. This allows a greater amount of light to impinge upon the peripheral portion of the semiconductor wafer W where a temperature decrease is prone to occur when the semiconductor wafer W is heated by the irradiation thereof with light from the halogen heating part 4.

The group of halogen lamps HL in the upper tier and the group of halogen lamps HL in the lower tier are arranged to intersect each other in a lattice pattern. In other words, the 40 halogen lamps HL in total are disposed so that the longitudinal direction of the 20 halogen lamps HL arranged in the upper tier and the longitudinal direction of the 20 halogen lamps HL arranged in the lower tier are orthogonal to each other.

Each of the halogen lamps HL is a filament-type light source which passes current through a filament disposed in a glass tube to make the filament incandescent, thereby emitting light. A gas prepared by introducing a halogen element (iodine, bromine and the like) in trace amounts into an inert gas such as nitrogen, argon and the like is sealed in the glass tube. The introduction of the halogen element allows the temperature of the filament to be set at a high temperature while suppressing a break in the filament.

Thus, the halogen lamps HL have the properties of having a longer life than typical incandescent lamps and being capable of continuously emitting intense light. That is, the halogen lamps HL are continuous lighting lamps that emit light continuously for not less than one second. In addition, the halogen lamps HL, which are rod-shaped lamps, have a long life. The arrangement of the halogen lamps HL in a horizontal direction provides good efficiency of radiation toward the semiconductor wafer W provided over the halogen lamps HL.

As shown in FIG. 1, the chamber 6 is provided with the two radiation thermometers (pyrometers in the present preferred embodiment): the first radiation thermometer 20a and the second radiation thermometer 20b. The first radiation thermometer 20a and the second radiation thermometer 20b are provided obliquely below the semiconductor wafer W held by the susceptor 74.

With such an arrangement, the first radiation thermometer 20a and the second radiation thermometer 20b detect the brightness temperature of the semiconductor wafer W from obliquely below the semiconductor wafer W. The brightness temperature refers to a physical quantity that indicates the radiation intensity of an electromagnetic wave. If electromagnetic radiation is blackbody radiation, the brightness temperature is equal to temperature.

Figure 8:
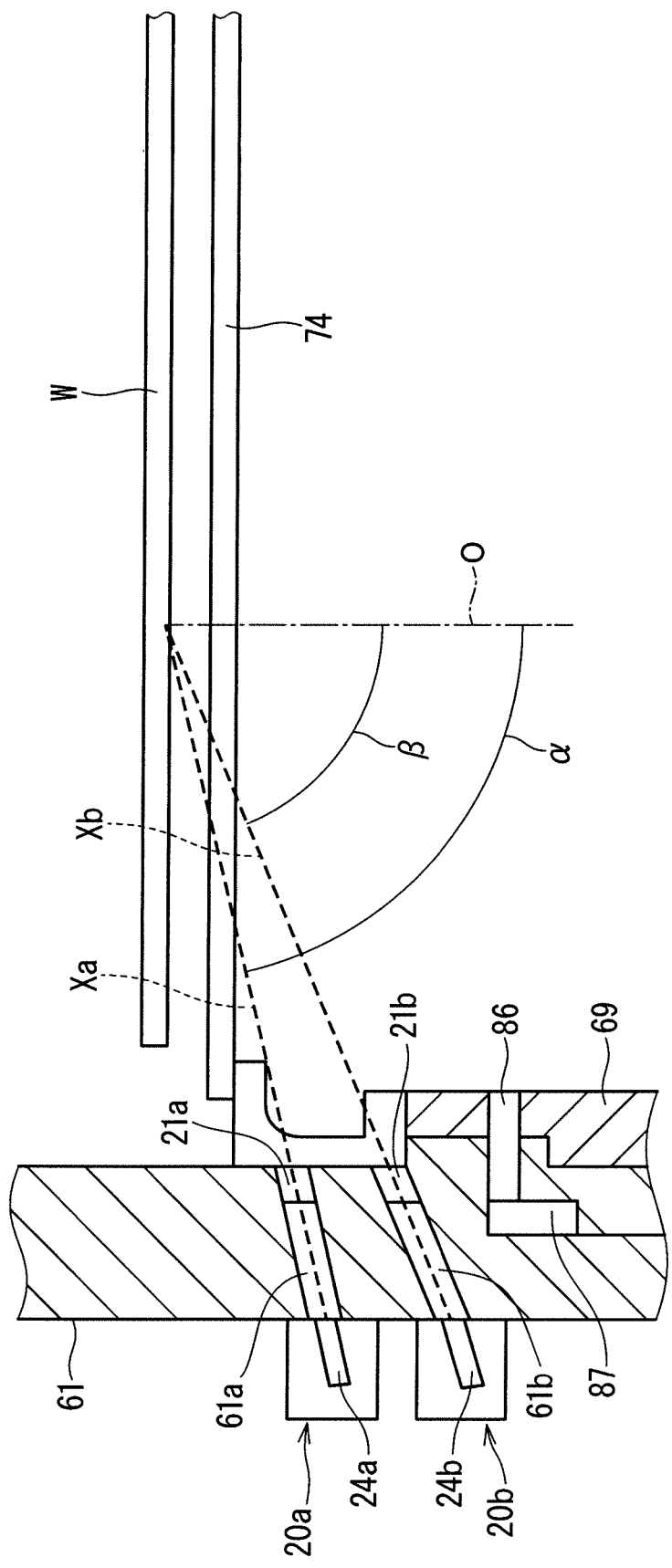
FIG. 8 is an enlarged partial view of FIG. 1.

FIG. 8 is an enlarged partial view of FIG. 1. FIG. 8 shows a positional relationship between the first radiation thermometer 20a, the second radiation thermometer 20b, and the semiconductor wafer W in the heat treatment apparatus 160 in detail.

As shown in FIG. 8, an angle α is formed between a path Xa of light received by the first radiation thermometer 20a and a normal O to the back surface of the semiconductor wafer W. Also, an angle β is formed between a path Xb of light received by the second radiation thermometer 20b and the normal O to the back surface of the semiconductor wafer W. The angle α and the angle β differ from each other. The angle α is preferably not less than 80 degrees (less than 90 degrees), and the angle β is preferably not more than 80 degrees. A difference between the angle α and the angle β is preferably not less than 2.5 degrees. The greater the difference between the angle α and the angle β is, the more accurately the temperature of the semiconductor wafer W is considered to be measured.

Figure 9:
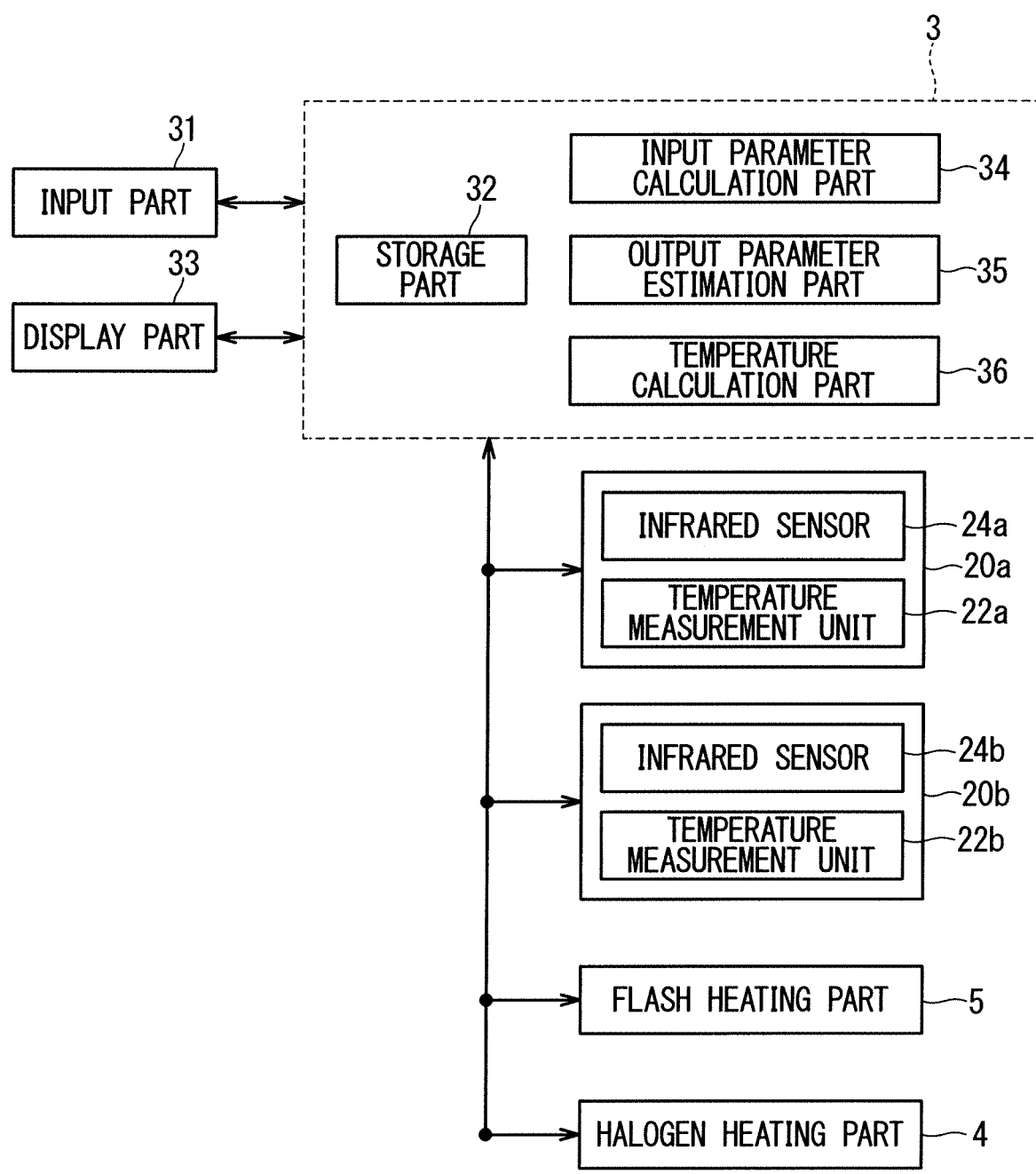
FIG. 9 is a diagram showing a relationship between a first radiation thermometer, a second radiation thermometer, and a controller.

FIG. 9 is a diagram showing a relationship between the first radiation thermometer 20a, the second radiation thermometer 20b, and the controller 3.

As mentioned above, the heat treatment apparatus 160 includes the controller 3 for controlling the operating mechanisms provided in the halogen heating part 4, the flash heating part 5, and the chamber 6. The controller 3 may be in the form of a personal computer (FA PC), and includes a storage part 32 and an arithmetic processor such as a CPU. The storage part 32 includes a storage device such as a solid-state memory device and a hard disk drive. The controller 3 is connected to an input part 31 and a display part 33. The input part 31 includes an input device such as a keyboard, a pointing device, and a touch panel. The input part 31 further includes a communication module for communication with a host computer. The display part 33 includes, for example, a liquid crystal display, and displays various pieces of information in cooperation with the controller 3. A liquid crystal display is employed as an example of the display part 33. The CPU in the controller 3 executes a predetermined processing program, whereby the processes in the heat treatment apparatus 160 proceed.

As shown in FIG. 9, the controller 3 includes an input parameter calculation part 34, an output parameter estimation part 35, and a temperature calculation part 36. The input parameter calculation part 34, the output parameter estimation part 35, and the temperature calculation part 36 are functional processing parts implemented by the CPU of the controller 3 executing a predetermined processing program. The details on the processing in the input parameter calculation part 34, the output parameter estimation part 35, and the temperature calculation part 36 will be further described later.

As shown in FIGS. 8 and 9, the first radiation thermometer 20a and the second radiation thermometer 20b are provided below the semiconductor wafer W. The first radiation thermometer 20a includes the infrared sensor 24a and a temperature measurement unit 22a which measure the temperature of the lower surface (back surface) of the semiconductor wafer W. Similarly, the second radiation thermometer 20b includes the infrared sensor 24b and a temperature measurement unit 22b which measure the temperature of the lower surface (back surface) of the semiconductor wafer W.

The infrared sensor 24a is electrically connected to the temperature measurement unit 22a, and transmits a detection signal generated in response to the reception of light to the temperature measurement unit 22a. The temperature measurement unit 22a calculates temperature from the detection signal transmitted thereto. In other words, the temperature measurement unit 22a calculates the temperature, based on the intensity of light received by the infrared sensor 24a. Similarly, the infrared sensor 24b is electrically connected to the temperature measurement unit 22b, and transmits a detection signal generated in response to the reception of light to the temperature measurement unit 22b. The temperature measurement unit 22b calculates temperature from the detection signal transmitted thereto. In other words, the temperature measurement unit 22b calculates the temperature, based on the intensity of light received by the infrared sensor 24b.

The heat treatment apparatus 160 further includes, in addition to the aforementioned components, various cooling structures to prevent an excessive temperature rise in the flash heating part 5, the halogen heating part 4, and the chamber 6 because of the heat energy generated from the halogen lamps HL and the flash lamps FL during the heat treatment of a semiconductor wafer W.

As an example, a water cooling tube (not shown) is provided in the walls of the chamber 6. Also, the flash heating part 5 and the halogen heating part 4 have an air cooling structure for forming a gas flow therein to exhaust heat. Air is supplied to a gap between the upper chamber window 63 and the lamp light radiation window 53 to cool down the flash heating part 5 and the upper chamber window 63.

<Operation of Heat Treatment Apparatus>

Figure 10:
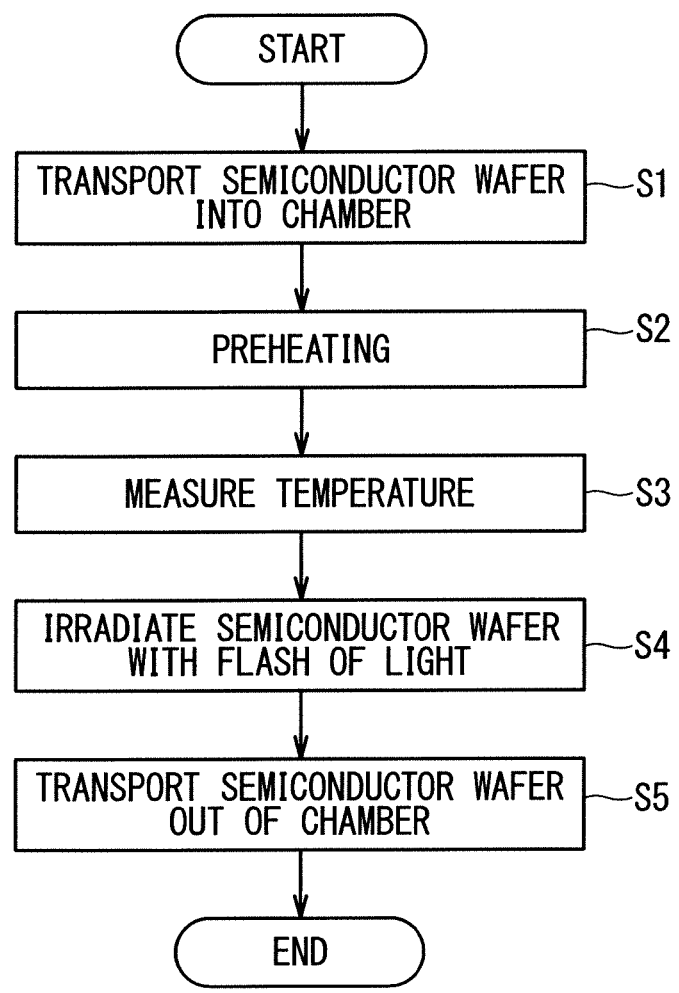
FIG. 10 is a flow diagram showing a procedure for treatment of a semiconductor wafer.

Next, a procedure for the treatment of a semiconductor wafer W in the heat treatment apparatus 160 will be described. FIG. 10 is a flow diagram showing the procedure for the treatment of the semiconductor wafer W. The procedure for the treatment in the heat treatment apparatus 160 which will be described below proceeds under the control of the controller 3 over the operating mechanisms of the heat treatment apparatus 160.

First, the valve 84 for supply of gas is opened, and the valves 89 and 192 for exhaust of gas are opened, so that the supply and exhaust of gas into and out of the chamber 6 start. When the valve 84 is opened, nitrogen gas is supplied through the gas supply opening 81 into the heat treatment space 65. When the valve 89 is opened, the gas within the chamber 6 is exhausted through the gas exhaust opening 86. This causes the nitrogen gas supplied from an upper portion of the heat treatment space 65 in the chamber 6 to flow downwardly and then to be exhausted from a lower portion of the heat treatment space 65.

The gas within the chamber 6 is exhausted also through the transport opening 66 by opening the valve 192. Further, the exhaust mechanism not shown exhausts the atmosphere around the drivers of the transfer mechanism 10. It should be noted that the nitrogen gas is continuously supplied into the heat treatment space 65 during the heat treatment of the semiconductor wafer W in the heat treatment apparatus 160. The amount of nitrogen gas supplied into the heat treatment space 65 is changed as appropriate in accordance with process steps.

Subsequently, the gate valve 162 is opened to open the transport opening 66. A transport robot outside the heat treatment apparatus 160 transports a semiconductor wafer W to be treated through the transport opening 66 into the heat treatment space 65 of the chamber 6 (Step S1). At this time, there is a danger that an atmosphere outside the heat treatment apparatus 160 is carried into the heat treatment space 65 as the semiconductor wafer W is transported into the heat treatment space 65. However, the nitrogen gas is continuously supplied into the chamber 6. Thus, the nitrogen gas flows outwardly through the transport opening 66 to minimize the outside atmosphere carried into the heat treatment space 65.

The semiconductor wafer W transported into the heat treatment space 65 by the transport robot is moved forward to a position lying immediately over the holder 7 and is stopped thereat. Then, the pair of transfer arms 11 of the transfer mechanism 10 is moved horizontally from the retracted position to the transfer operation position and is then moved upwardly, whereby the lift pins 12 pass through the through holes 79 and protrude from the upper surface of the holding plate 75 of the susceptor 74 to receive the semiconductor wafer W. At this time, the lift pins 12 move upwardly to above the upper ends of the support pins 77.

After the semiconductor wafer W is placed on the lift pins 12, the transport robot moves out of the heat treatment space 65, and the gate valve 162 closes the transport opening 66.

Then, the pair of transfer arms 11 moves downwardly to transfer the semiconductor wafer W from the transfer mechanism 10 to the susceptor 74 of the holder 7, so that the semiconductor wafer W is held in a horizontal attitude from below. The semiconductor wafer W is supported by the support pins 77 provided upright on the holding plate 75 shown in FIGS. 2 to 4, and is held by the susceptor 74. A predetermined distance is defined between the lower surface (back surface) of the semiconductor wafer W supported by the support pins 77 and the holding surface 75a of the holding plate 75. The pair of transfer arms 11 moved downwardly below the susceptor 74 is moved back to the retracted position, i.e. to the inside of the recessed portion 62, by the horizontal movement mechanism 13.

After the semiconductor wafer W is transported into the chamber 6 and held by the susceptor 74, the halogen lamps HL in the halogen heating part 4 turn on simultaneously to start preheating (or assist-heating) (Step S2). Halogen light emitted from the halogen lamps HL is transmitted through the lower chamber window 64 made of quartz, and impinges upon the lower surface (back surface) of the semiconductor wafer W. By receiving light irradiation from the halogen lamps HL, the semiconductor wafer W is preheated, so that the temperature of the semiconductor wafer W increases. It should be noted that the transfer arms 11 of the transfer mechanism 10, which are retracted to the inside of the recessed portion 62, do not become an obstacle to the heating using the halogen lamps HL. The preheating temperature is preferably on the order of 500° to 600° C. at which there is no apprehension that the impurities implanted in the semiconductor wafer W are diffused by heat. Accurate temperature control is required because the impurities implanted in the semiconductor wafer W are diffused when the preheating temperature reaches a high temperature of 800° C. or above.

The temperature of the semiconductor wafer W which is on the increase by the irradiation with light from the halogen lamps HL is measured by the first radiation thermometer 20a and the second radiation thermometer 20b (Step S3). More specifically, the temperature of the lower surface (back surface) of the semiconductor wafer W is calculated from the detection signals detected by the first and second radiation thermometers 20a and 20b. The temperature measurement by means of the first and second radiation thermometers 20a and 20b may be started prior to the start of the preheating by means of the halogen lamps HL.

The reason why the temperature of the lower surface (back surface) of the semiconductor wafer W is calculated in the present preferred embodiment will be described. In general, various films are formed on the upper surface (front surface) of the semiconductor wafer W. With higher performance of semiconductor wafers W in recent years, conditions for film type, film thickness, the number of film layers, film structure, and the like have become more divergent than before. On the other hand, films tend not to be actively formed on the lower surface (back surface) of the semiconductor wafers W. It is easier to measure the temperature of the lower surface (back surface) of the semiconductor wafers W where films are not actively formed than to measure the temperature of the upper surface (front surface) of the semiconductor wafers W where the requirements for the diversified film type, film thickness, number of film layers, and film structure must be met. For this reason, the first radiation thermometer 20a and the second radiation thermometer 20b in the present preferred embodiment are disposed obliquely below the semiconductor wafer W to measure the temperature of the lower surface (back surface) of the semiconductor wafer W.

Figure 11:
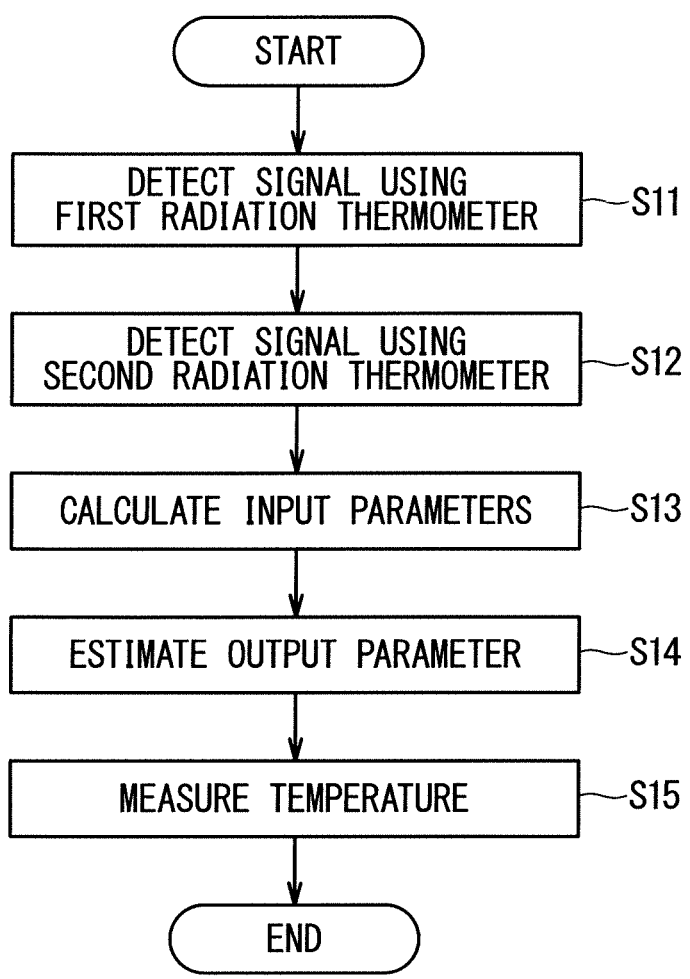
FIG. 11 is a flow diagram showing a procedure for a temperature measurement method.

FIG. 11 is a flow diagram showing a procedure for the temperature measurement method in the present preferred embodiment.

The measurement of the temperature of the semiconductor wafer W in FIG. 10 is performed in accordance with the procedure as shown in FIG. 11. First, the first radiation thermometer 20a detects a brightness temperature $S_a$ of the back surface of the semiconductor wafer W (Step S11). Also, the second radiation thermometer 20b detects a brightness temperature $S_b$ of the back surface of the semiconductor wafer W (Step S12). It should be noted that Steps S11 and S12 may be performed at the same time.

The brightness temperature $S_a$ detected in Step S11 and the brightness temperature $S_b$ detected in Step S12 are stored in the storage part 32. Input parameters are calculated based on the brightness temperature $S_a$ and the brightness temperature $S_b$ (Step S13). The calculation of the input parameters is performed in the input parameter calculation part 34 shown in FIG. 9. The input parameter calculation part 34 calculates a first input parameter corresponding to an emissivity ratio Ku of the semiconductor wafer W and a second input parameter corresponding to a temperature of the semiconductor wafer W from the brightness temperatures $S_a$ and $S_b$ detected by the first and second radiation thermometers 20a and 20b.

More specifically, the emissivity ratio Ku as the first input parameter is calculated based on the brightness temperature $S_a$ and the brightness temperature $S_b$. The emissivity ratio Ku is calculated by $$\left(\frac{\varepsilon_b}{\varepsilon_a}\right)^\lambda = \exp\left\{C_2\left(\frac{1}{S_a} - \frac{1}{S_b}\right)\right\} \qquad (1)$$
$$= Ku$$

where $\lambda$ is a measurement wavelength [μm], $\varepsilon_a$ is a spectral emissivity [μm] of the first radiation thermometer 20a at the measurement wavelength, $\varepsilon_b$ is a spectral emissivity [μm] of the second radiation thermometer 20b at the measurement wavelength, $C_2$ is the second radiation constant in Planck's radiation law, $S_a$ is the brightness temperature [K] detected by the first radiation thermometer 20a at the measurement wavelength, and $S_b$ is the brightness temperature [K] detected by the second radiation thermometer 20b at the measurement wavelength.

By using Equation (1) described above, the emissivity ratio Ku is derived even if the emissivity $\varepsilon_a$ and the emissivity $\varepsilon_b$ are unknown. Silicon (Si), which is considered as one of the materials of the semiconductor wafer W, has an emissivity that varies with temperature. Specifically, silicon (Si) or silicon compounds change in color depending on temperature, and accordingly vary in emissivity. Thus, the temperature measurement method of the present preferred embodiment is particularly effective when silicon (Si) is used as the material of the semiconductor wafer W or when a silicon compound film is formed on the semiconductor wafer W. In addition, silico (Si) has a particularly pronounced tendency to vary in emissivity in a low-temperature range of 600° C. or below.

A brightness temperature Save which is the average of the brightness temperature $S_a$ and the brightness temperature $S_b$ is calculated as the second input parameter. It should be noted that any one of the brightness temperature $S_a$ and the brightness temperature $S_b$ may be employed as the second input parameter.

After the input parameters are calculated as described above, an output parameter (log ratio Ld) is estimated based on the first input parameter and the second input parameter (Step S14). The estimation of the output parameter (log ratio Ld) is performed by the output parameter estimation part 35 shown in FIG. 9. The output parameter estimation part 35 estimates the output parameter from the first input parameter and the second input parameter. A correlation between the emissivity ratio Ku as the first input parameter, the brightness temperature Save as the second input parameter, and the log ratio Ld as the output parameter is previously stored in the storage part 32. The correlation may be obtained from values measured by experiment or values calculated by theoretical calculation.

Figure 12:
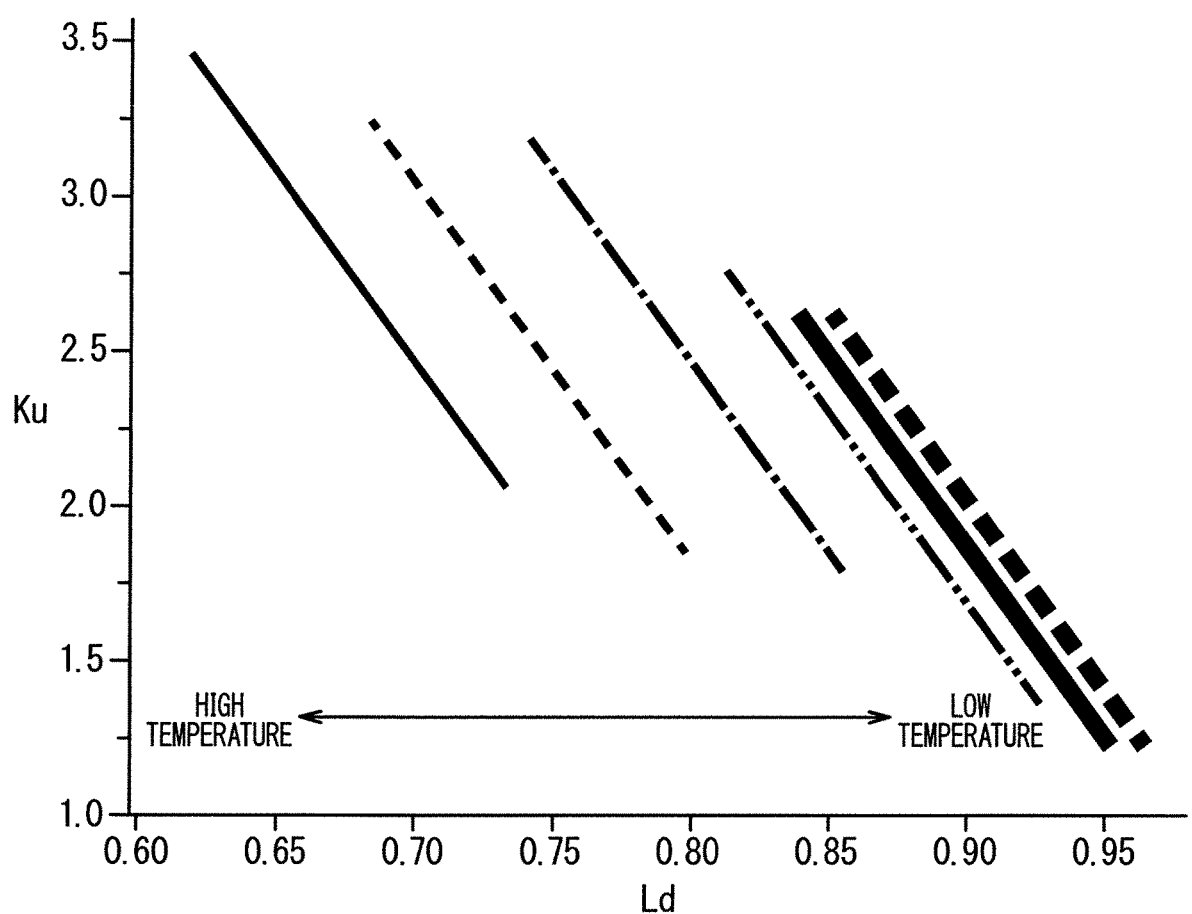
FIG. 12 is a correlation chart showing a relationship between a first input parameter and an output parameter.

FIG. 12 is a correlation chart showing a relationship between the first input parameter and the output parameter. In FIG. 12, the ordinate represents the first input parameter (emissivity ratio Ku), and the abscissa represents the output parameter (log ratio Ld). In FIG. 12, the solid line is an approximate line representing measured values obtained when the value of the brightness temperature Save is 600° C. (in terms of degree Celsius); the dotted line is an approximate line representing measured values obtained when the value of the brightness temperature Save is 500° C. (in terms of degree Celsius); the dash-dot line is an approximate line representing measured values obtained when the value of the brightness temperature Save is 400° C. (in terms of degree Celsius); the dash-double-dot line is an approximate line representing measured values obtained when the value of the brightness temperature Save is 300° C. (in terms of degree Celsius); the thick solid line is an approximate line representing measured values obtained when the value of the brightness temperature Save is 200° C. (in terms of degree Celsius); and the thick dotted line is an approximate line representing measured values obtained when the value of the brightness temperature Save is 100° C. (in terms of degree Celsius). There are shown in FIG. 12 the results of experiments conducted on a semiconductor wafer W made of silicon without films, a semiconductor wafer W with a SiN film of 200 nm deposited thereon, a semiconductor wafer W with a SiN film of 500 nm deposited thereon, a semiconductor wafer W with a SiN film of 1000 nm deposited thereon, a semiconductor wafer W with a $SiO_2$ film of 100 nm deposited thereon, a semiconductor wafer W with a $SiO_2$ film of 200 nm deposited thereon, a semiconductor wafer W with a $SiO_2$ film of 500 nm deposited thereon, and a semiconductor wafer W with a $SiO_2$ film of 1000 nm deposited thereon.

In Step S14, the log ratio Ld between emissivities as the output parameter is estimated from the correlation shown in the correlation chart of FIG. 12. The log ratio Ld is defined by $$Ld = \frac{\ln\varepsilon_a}{\ln\varepsilon_b} \quad (2)$$

The temperature T of the lower surface (back surface) of the semiconductor wafer W is measured (Step S15) based on the log ratio Ld estimated in Step S14. The procedure is completed by the measurement of the temperature T of the semiconductor wafer W. The calculation of the temperature T is performed by the temperature calculation part 36 shown in FIG. 9. The temperature calculation part 36 calculates the temperature of the semiconductor wafer W from the output parameter (log ratio Ld) estimated by the output parameter estimation part 35, the brightness temperature $S_a$ detected by the first radiation thermometer 20a, and the brightness temperature $S_b$ detected by the second radiation thermometer 20b. In Step S15, the temperature T is calculated by $$T = \frac{1 - Ld}{\frac{1}{S_a} - Ld \cdot \frac{1}{S_b}} \quad (3)$$

Figure 13:
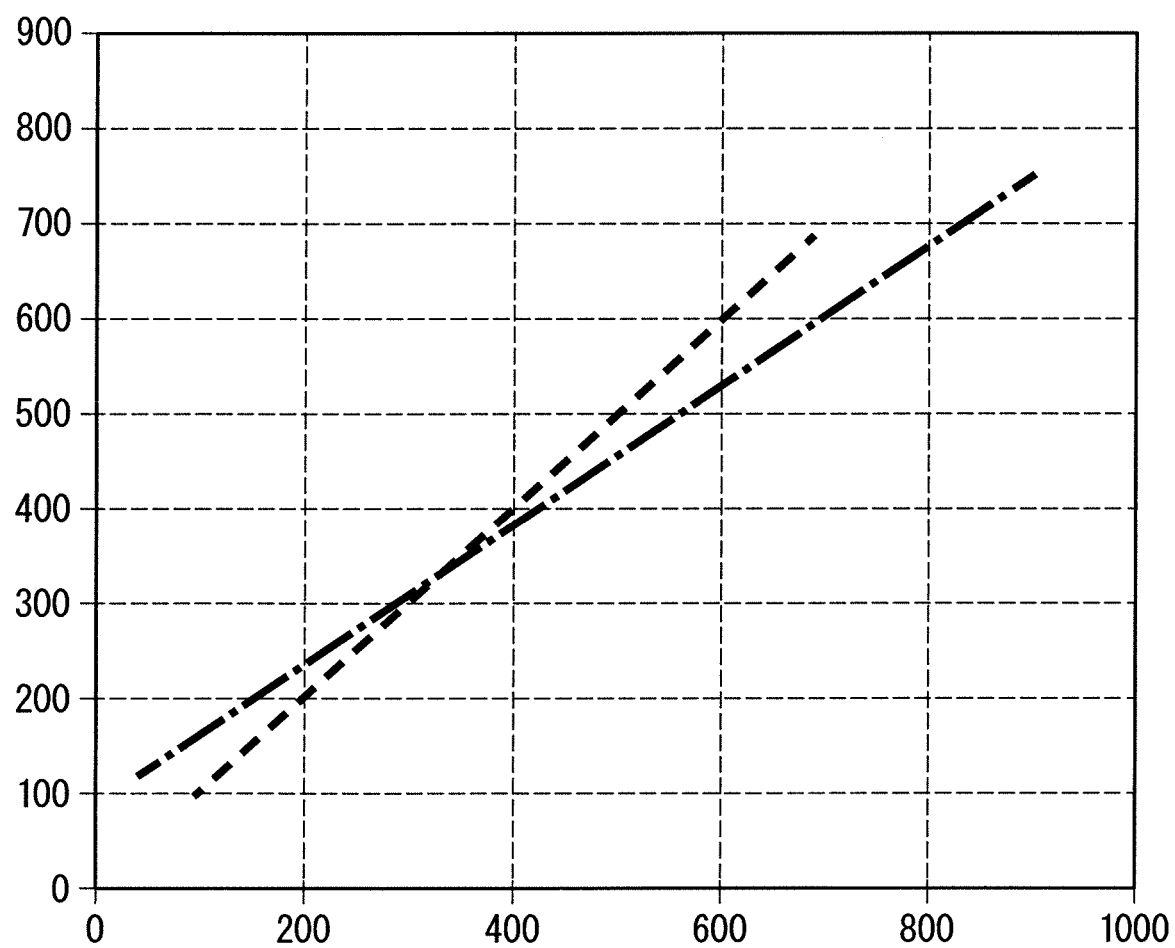
FIG. 13 is a graph showing a relationship between estimated and measured values of temperature.

FIG. 13 is a graph showing a relationship between estimated and measured values of the temperature T. In FIG. 13, the thick dotted line is an approximate line representing values of the temperature T calculated by the temperature measurement method of the present preferred embodiment; and the dash-dot line is an approximate line representing values of the temperature T calculated by the method disclosed in Japanese Patent Application Laid-Open No. 5-215610 (1993). In FIG. 13, the ordinate represents the measured value, and the abscissa represents the estimated value. It should be noted that an instance in which the measured value is 800° C. or below is shown in FIG. 13.

As shown in FIG. 13, the line obtained when the temperature T is calculated by the temperature measurement method of the present preferred embodiment is closer to the ideal line than the line obtained when the temperature T is calculated by the method disclosed in Japanese Patent Application Laid-Open No. 5-215610 (1993). In other words, it is found that the estimated value is closer to the measured value when the temperature T is calculated by the temperature measurement method of the present preferred embodiment. This is especially pronounced when the measured value is 400° C. or above.

Referring again to FIG. 10, the flash lamps FL in the flash heating part 5 irradiate the upper surface of the semiconductor wafer W held by the susceptor 74 with a flash of light (Step S4) when the temperature of the semiconductor wafer W reaches a predetermined temperature. At this time, part of the flash of light emitted from the flash lamps FL travels directly toward the interior of the chamber 6. The remainder of the flash of light is reflected once from the reflector 52, and then travels toward the interior of the chamber 6. The irradiation of the semiconductor wafer W with such flashes of light achieves the flash heating of the semiconductor wafer W.

The flash heating, which is achieved by the emission of a flash of light from the flash lamps FL, is capable of increasing the temperature of the upper surface of the semiconductor wafer W in a short time. Specifically, the flash of light emitted from the flash lamps FL is an intense flash of light emitted for an extremely short period of time ranging from about 0.1 to about 100 milliseconds as a result of the conversion of the electrostatic energy previously stored in the capacitor into such an ultrashort light pulse. The temperature of the upper surface of the semiconductor wafer W is abruptly increased within an extremely short time by the flash irradiation from the flash lamps FL. The temperature of the semiconductor wafer W may be monitored by the continuous temperature measurement in Step S3.

After the completion of the flash irradiation, the halogen lamps HL turn off. This causes the temperature of the semiconductor wafer W to decrease rapidly. The temperature of the semiconductor wafer W which is on the decrease may be measured by the continuous temperature measurement in Step S3. The result of measurement may be transmitted to the controller 3 which in turn monitors whether the temperature of the semiconductor wafer W is decreased to a predetermined temperature or not. After the temperature of the semiconductor wafer W is decreased to the predetermined temperature or below, the pair of transfer arms 11 of the transfer mechanism 10 is moved horizontally again from the retracted position to the transfer operation position and is then moved upwardly, so that the lift pins 12 protrude from the upper surface of the susceptor 74 to receive the heat-treated semiconductor wafer W from the susceptor 74. Subsequently, the transport opening 66 which has been closed is opened by the gate valve 162, and the transport robot outside the heat treatment apparatus 160 transports the semiconductor wafer W placed on the lift pins 12 out of the chamber 6 (Step S5).

As described above, the heat treatment apparatus 160 as the heat treatment apparatus in the present preferred embodiment and the temperature measurement method are capable of accurately measuring the temperature of the semiconductor wafer W. In particular, the temperature of the lower surface (back surface) the semiconductor wafer W is accurately measured in the present preferred embodiment because the brightness temperatures are detected from obliquely below the semiconductor wafer W.

Second Preferred Embodiment

Figure 14:
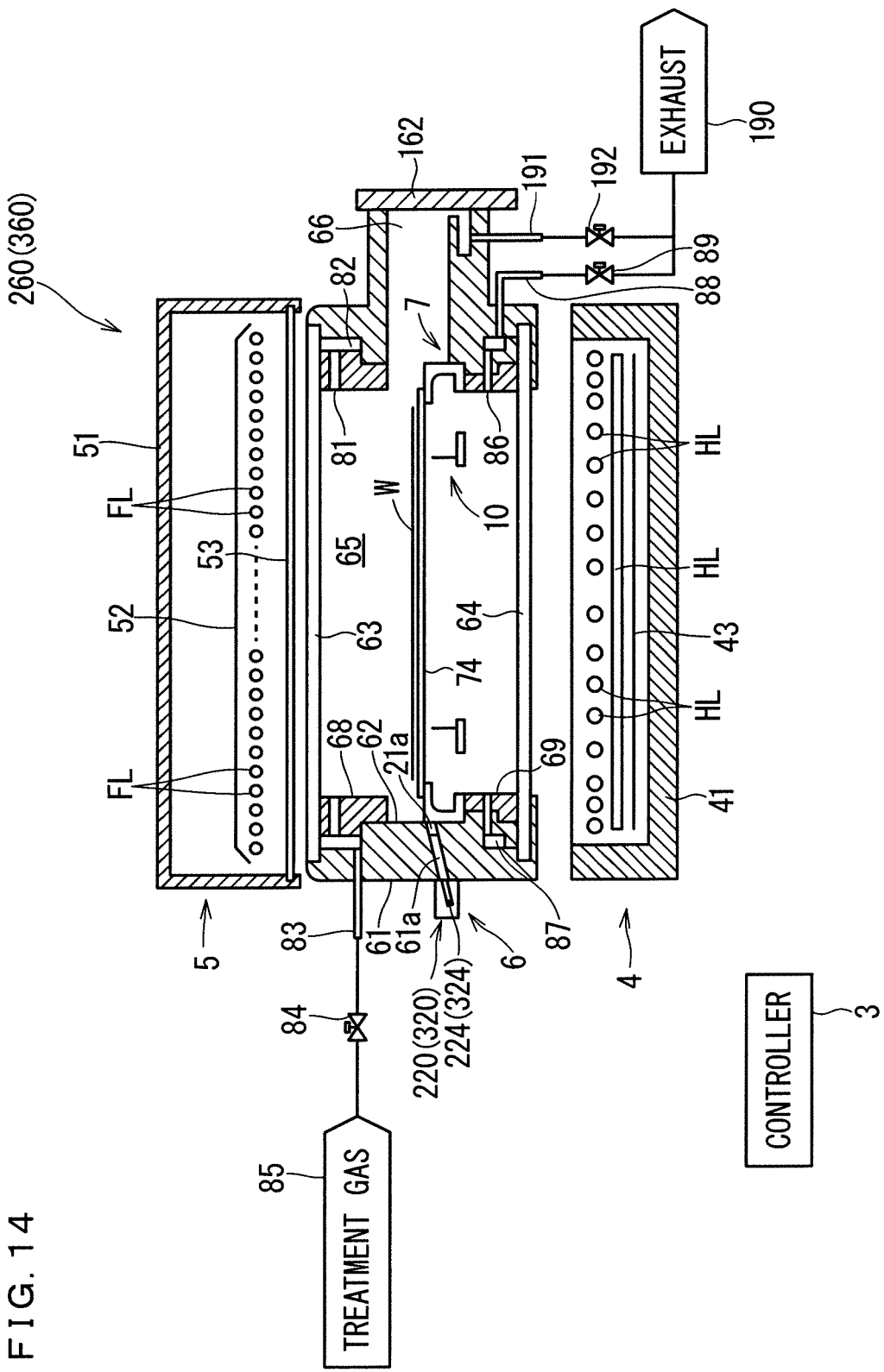
FIG. 14 is a sectional view schematically showing a configuration of the heat treatment apparatus according to a second preferred embodiment.

A second preferred embodiment of the present invention will be described below. FIG. 14 is a sectional view schematically showing a configuration of a heat treatment apparatus 260 according to the second preferred embodiment.

A radiation thermometer 220 is attached to a location where the through hole 61a of the heat treatment apparatus 260 in the second preferred embodiment is provided. A polarizing filter module 225 is rotatably provided inside the through hole 61a. The radiation thermometer 220 includes an infrared sensor 224 for measuring the temperature of the lower surface (back surface) of the semiconductor wafer W.

Figure 15:
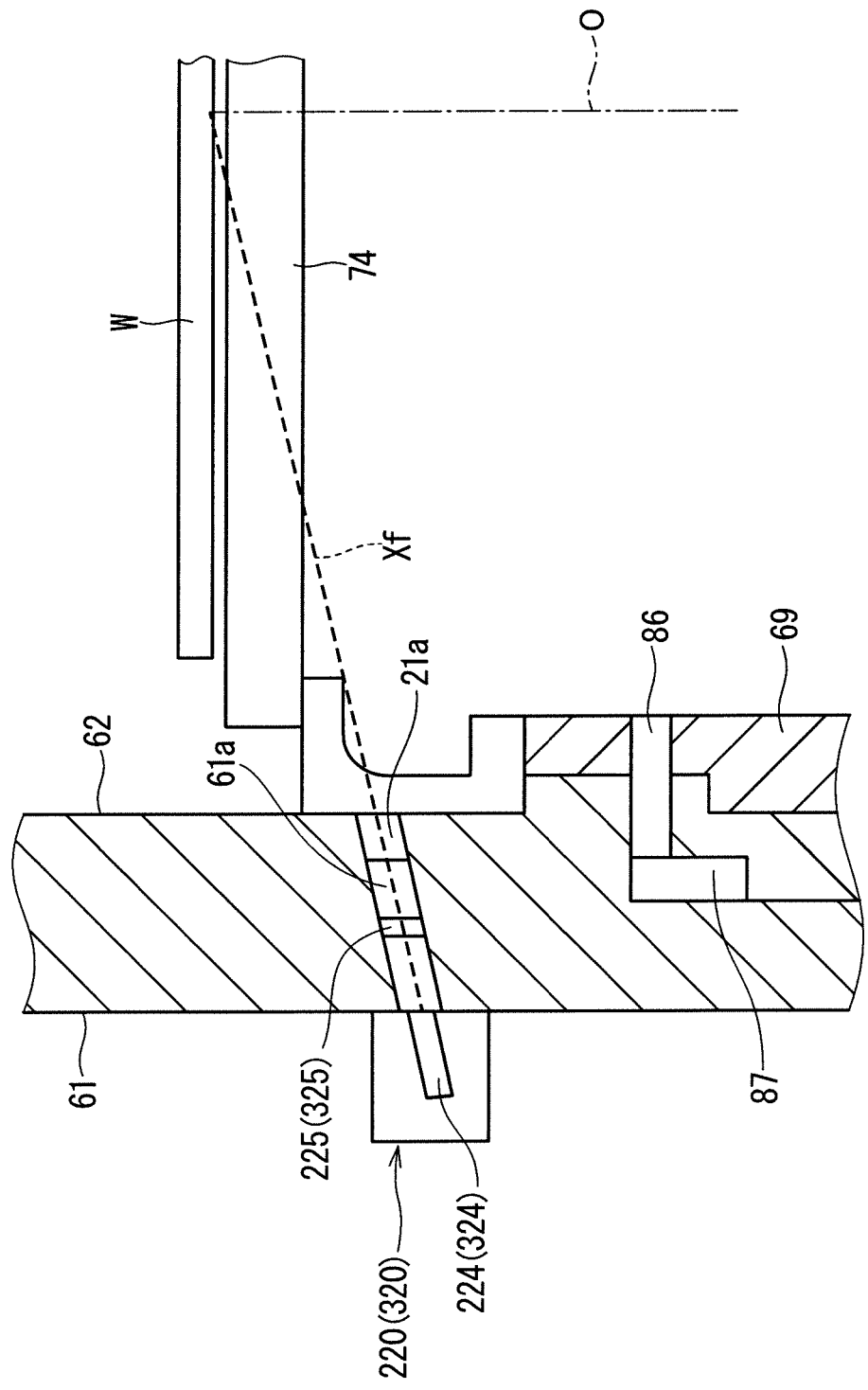
FIG. 15 is an enlarged partial view of FIG. 14.
Figure 16:
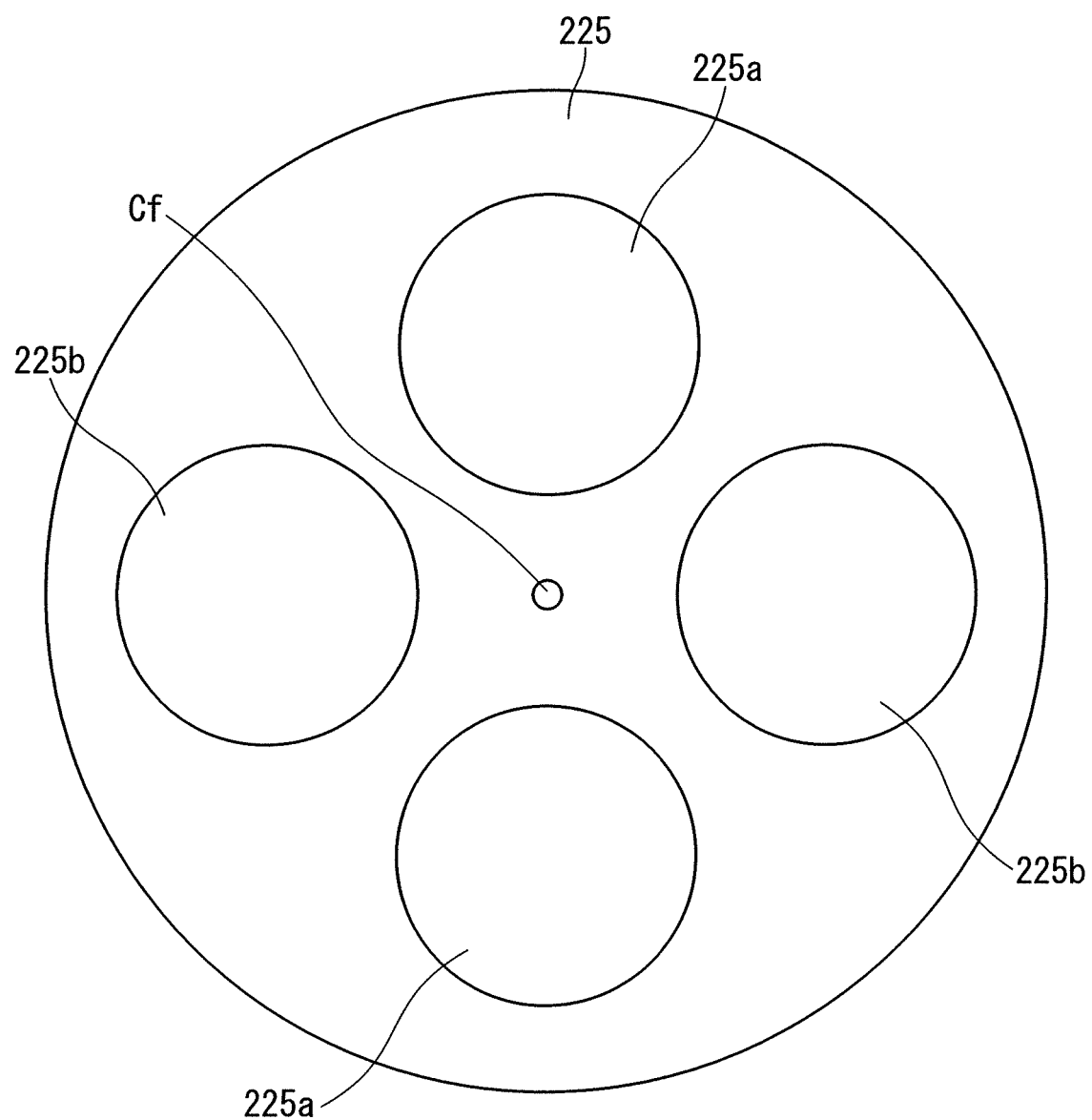
FIG. 16 is a plan view showing a polarizing filter module.

FIG. 15 is an enlarged partial view of FIG. 14. FIG. 15 shows a positional relationship between the radiation thermometer 220 and the semiconductor wafer W in the heat treatment apparatus 260 in detail. FIG. 16 is a plan view showing the polarizing filter module 225.

The polarizing filter module 225 is interposed in a path Xf of light received by the infrared sensor 224. The polarizing filter module 225 includes polarizing filters 225a and polarizing filters 225b. The polarizing filters 225a are S-polarizing filters, and the polarizing filters 225b are P-polarizing filters. The polarizing filter module 225 is rotated about a rotation axis Cf by a motor not shown.

This causes the light received by the infrared sensor 224 to switch between light passing through the polarizing filters 225a and light passing through the polarizing filters 225b. In other words, the infrared sensor 224 detects two different polarization components with the same angle between the path Xf of received light and the normal O to the back surface of the semiconductor wafer W. Thus, the heat treatment apparatus 260 of the second preferred embodiment obtains the two brightness temperatures by means of the single infrared sensor 224.

Third Preferred Embodiment

A third preferred embodiment of the present invention will be described below. A configuration of a heat treatment apparatus 360 according to the third preferred embodiment is also shown in FIGS. 14 and 15.

Figure 17:
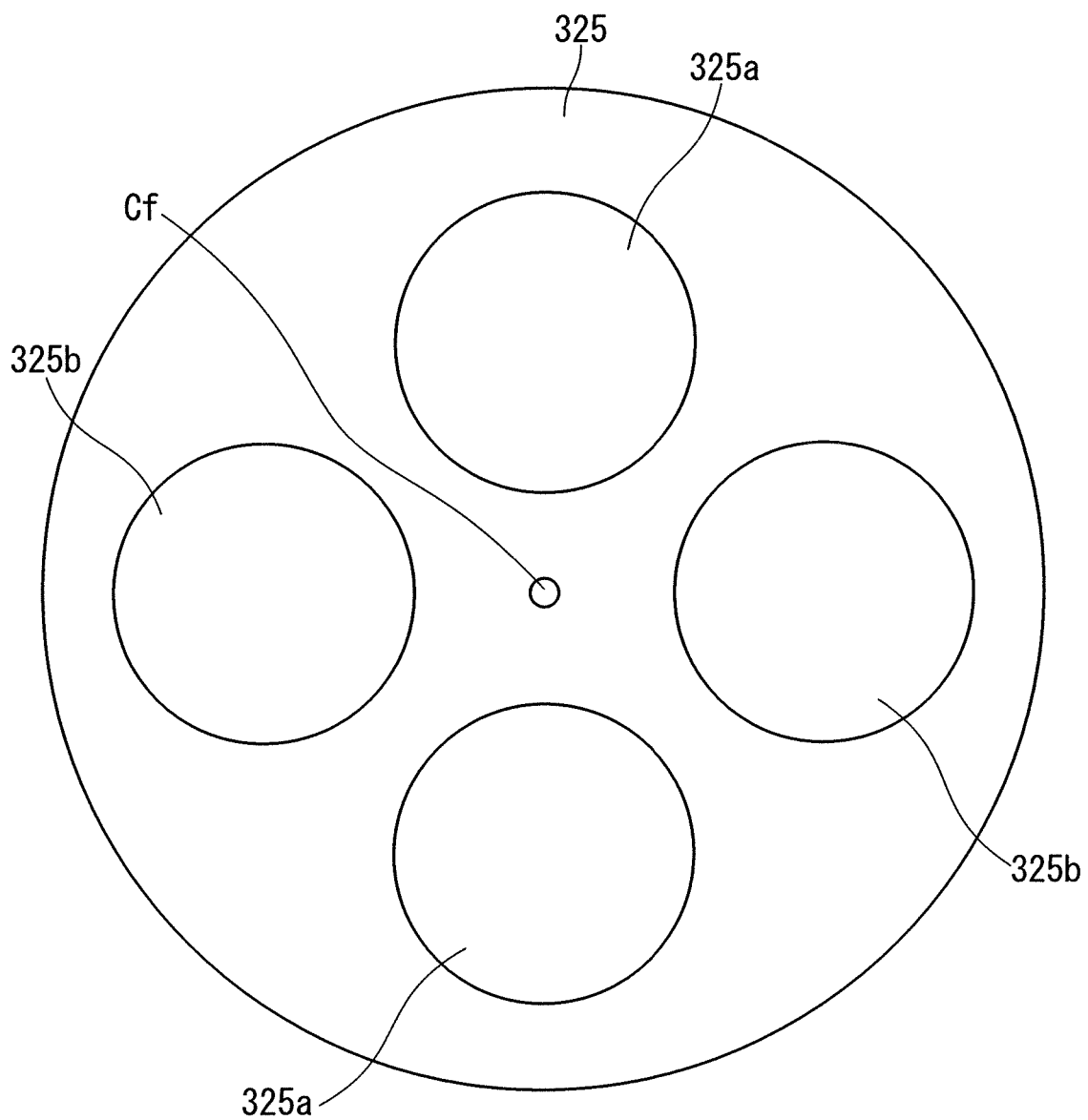
FIG. 17 is a plan view showing a spectral filter module.

In the third preferred embodiment, a spectral filter module 325 is rotatably provided inside the through hole 61a. FIG. 17 is a plan view showing the spectral filter module 325.

The spectral filter module 325 is interposed in the path Xf of light received by an infrared sensor 324. The spectral filter module 325 includes spectral filters 325a and spectral filters 325b. The spectral filters 325a are filters for obtaining a specific wavelength. The spectral filters 325b are filters for obtaining a specific wavelength different from that obtained by the spectral filters 325a. The spectral filter module 325 is rotated about the rotation axis Cf by a motor not shown.

This causes the light received by the infrared sensor 324 to switch between light passing through the spectral filters 325a and light passing through the spectral filters 325b. In other words, the infrared sensor 324 detects two different wavelength components with the same angle between the path Xf of received light and the normal O to the back surface of the semiconductor wafer W. Thus, the heat treatment apparatus 360 in the third preferred embodiment obtains the two brightness temperatures by means of the single infrared sensor 324.

For the measurement of the temperature of the semiconductor wafer W from the two brightness temperatures obtained by the infrared sensor 324, Equation (4) to be described below is used in place of Equation (1) described above, and Equation (5) to be described below is used in place of Equation (3) described above.

$$\left(\frac{\varepsilon_b \lambda_2}{\varepsilon_a \lambda_1}\right) = \exp\left\{C_2\left(\frac{1}{S_a} - \frac{1}{S_b}\right)\right\} \quad (4)$$
$$= Ku$$

$$T = \frac{\frac{\lambda_1}{\lambda_2} - Ld}{\frac{\lambda_1}{\lambda_2} \cdot \frac{1}{S_a} - Ld \cdot \frac{1}{S_b}} \quad (5)$$

Fourth Preferred Embodiment

Figure 18:
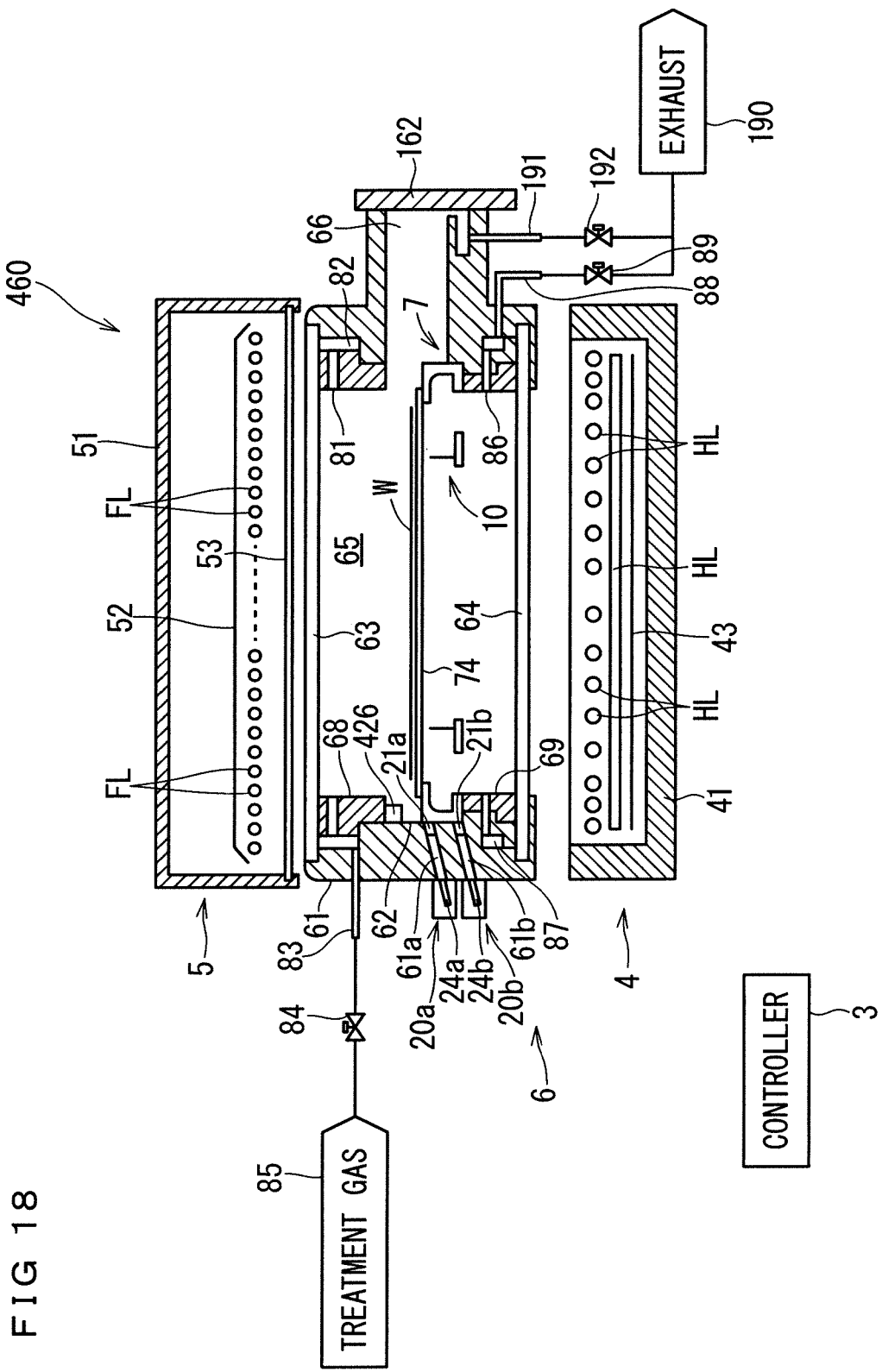
FIG. 18 is a sectional view schematically showing a configuration of the heat treatment apparatus according to a fourth preferred embodiment.

A fourth preferred embodiment of the present invention will be described below. FIG. 18 is a sectional view schematically showing a configuration of a heat treatment apparatus 460 according to the fourth preferred embodiment.

The heat treatment apparatus 460 in the fourth preferred embodiment includes a chamber thermometer 426 for measuring the temperature of the chamber 6 in addition to the components of the heat treatment apparatus 160 in the first preferred embodiment. The chamber thermometer 426 is attached, for example, to the recessed portion 62 of the chamber 6. This allows the heat treatment apparatus 460 in the fourth preferred embodiment to obtain the temperature inside the chamber 6 by means of the chamber thermometer 426. The input parameter calculation part in the fourth preferred embodiment further calculates a third input parameter corresponding to the temperature of the chamber 6. In the output parameter estimation step, the output parameter is estimated based on the first input parameter, the second input parameter, and the third input parameter.

The heat treatment apparatus 460 in the fourth preferred embodiment, in which the third parameter corresponding to the temperature of the chamber 6 is further calculated, is capable of more accurately measuring the temperature of the semiconductor wafer W which can also be related to the temperature of the chamber 6.

Fifth Preferred Embodiment

Figure 19:
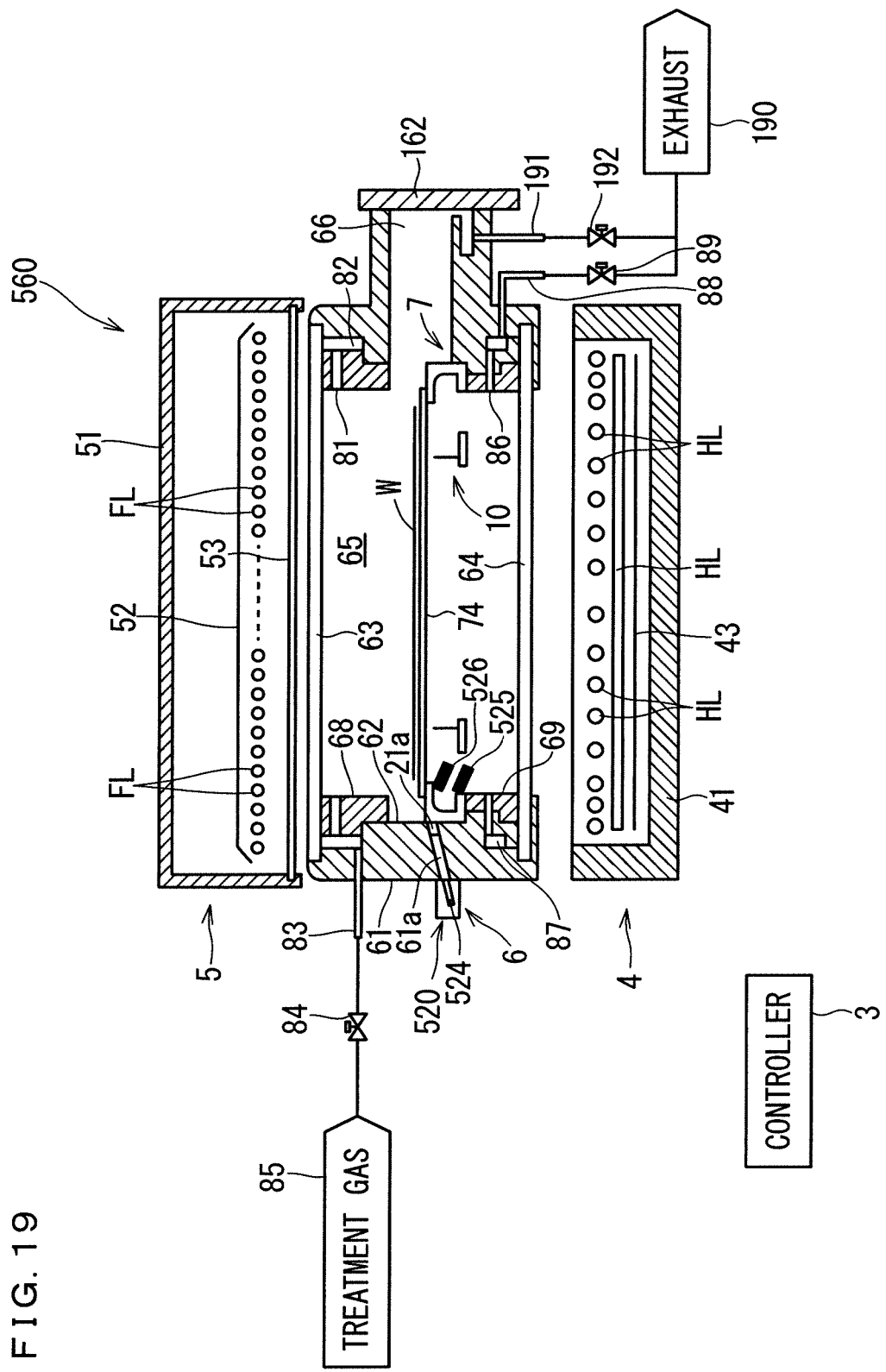
FIG. 19 is a sectional view schematically showing a configuration of the heat treatment apparatus according to a fifth preferred embodiment.
Figure 20:
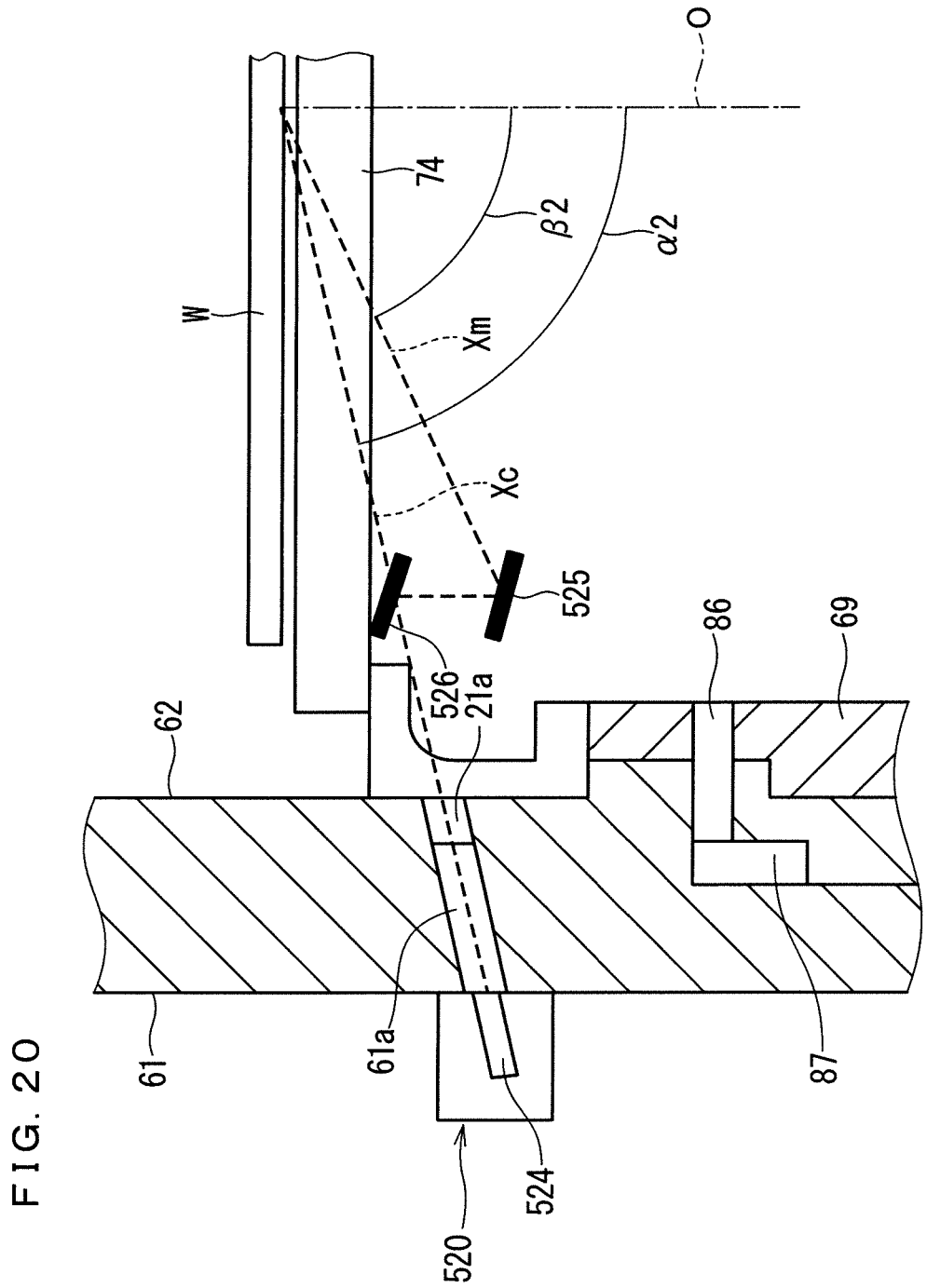
FIG. 20 is an enlarged partial view of FIG. 19.

A fifth preferred embodiment of the present invention will be described below. FIG. 19 is a sectional view schematically showing a configuration of a heat treatment apparatus 560 according to the fifth preferred embodiment. FIG. 20 is an enlarged partial view of FIG. 19. FIG. 20 shows a positional relationship between a radiation thermometer 520, a first mirror 525, a second mirror 526, and the semiconductor wafer W in the heat treatment apparatus 560 in detail.

The radiation thermometer 520 is attached to a location where the through hole 61a of the heat treatment apparatus 560 in the fifth preferred embodiment is provided. The heat treatment apparatus 560 further includes the first and second mirrors 525 and 526 for reflecting light toward the radiation thermometer 520.

The first mirror 525 is interposed in a path Xm of light. The second mirror 526 reflects the light reflected from the first mirror 525 further toward an infrared sensor 524.

This causes the infrared sensor 524 to receive light directed from the semiconductor wafer W directly toward the infrared sensor 524 and light directed through the first mirror 525 and the second mirror 526 toward the infrared sensor 524. In other words, the infrared sensor 524 detects the multiple brightness temperatures that are detected at the positions where the angles α2 and β2 formed by the paths Xc and Xm and the normal O of the back surface of the semiconductor wafer W are in different position from each other. Thus, the heat treatment apparatus 560 of the fifth preferred embodiment obtains the two brightness temperatures by means of the single infrared sensor 524.

Effects Produced by Aforementioned Preferred Embodiments

The following are examples of the effects produced by the aforementioned preferred embodiments. In the following description, the effects will be described based on the specific configurations exemplified in the aforementioned preferred embodiments. However, these specific configurations may be replaced with other specific configurations exemplified herein to the extent that similar effects are produced.

The replacement may be performed over at least two of the preferred embodiments. That is, the configurations exemplified in different ones of the preferred embodiments may be combined together to produce similar effects.

The temperature measurement method in the aforementioned preferred embodiments includes: a radiation temperature measurement step for detecting the brightness temperature of the semiconductor wafer W from obliquely below the semiconductor wafer W; an input parameter calculation step for calculating the two input parameters, i.e. the first input parameter corresponding to the ratio between emissivities of the semiconductor wafer W and the second input parameter corresponding to the temperature of the semiconductor wafer W, from the brightness temperature detected in the radiation temperature measurement step; an output parameter estimation step for estimating the output parameter from the first input parameter and the second input parameter; and a temperature calculation step for calculating the temperature of the semiconductor wafer W from the output parameter estimated in the output parameter estimation step and the brightness temperature detected in the radiation temperature measurement step.

In the output parameter estimation step, the output parameter is estimated based on a correlation between the first input parameter specified by the second input parameter and the output parameter.

In the temperature measurement method of the first and fourth preferred embodiments, in the radiation temperature measurement step, the multiple brightness temperatures that are detected when the angles α and β formed by the light paths Xa and Xb to be received and the normal O of the back surface of the semiconductor wafer W in different position from each other, by the first radiation thermometer 20a and the second radiation thermometer 20b.

In the temperature measurement method of the second preferred embodiment, the two different polarization components with the same angle between the path Xf of received light and the normal O to the back surface of the semiconductor wafer W are detected in the radiation temperature measurement step.

In the temperature measurement method of the third preferred embodiment, the two different wavelength components with the same angle between the path of received light and the normal O to the back surface of the semiconductor wafer W are detected in the radiation temperature measurement step.

In the temperature measurement method of the fourth preferred embodiment, the semiconductor wafer W is heated while being received in the chamber 6. The third input parameter corresponding to the temperature of the chamber 6 is further calculated in the input parameter calculation step, and the output parameter is estimated in the output parameter estimation step, based on the first input parameter, the second input parameter, and the third input parameter.

According to such a configuration, the temperature of the semiconductor wafer W is accurately measured even if the emissivities are unknown. In addition, the radiation temperature measurement step is capable of accurately measuring the temperature of the back surface of the semiconductor wafer W because the brightness temperature is detected from obliquely below the semiconductor wafer W. According to the configuration of the fourth preferred embodiment, the input parameter calculation step is capable of measuring the temperature of the semiconductor wafer W which can also be related to the temperature of the chamber 6 because the third input parameter corresponding to the temperature of the chamber 6 is further calculated.

According to the aforementioned preferred embodiments, the heat treatment apparatuses 160, 260, 360, 460, and 560 for irradiating the semiconductor wafer W with light to heat the semiconductor wafer W include: the chamber 6 for receiving the semiconductor wafer W therein; the susceptor 74 for placing and holding the semiconductor wafer W thereon within the chamber 6; the first and second radiation thermometers 20a and 20b (or the radiation thermometers 220, 320, and 520) provided obliquely below the susceptor 74 and for detecting the brightness temperature of the semiconductor wafer W; the input parameter calculation part 34 for calculating the two input parameters, i.e. the first input parameter corresponding to the emissivity ratio of the semiconductor wafer W and the second input parameter corresponding to the temperature of the semiconductor wafer W, from the brightness temperatures detected by the first and second radiation thermometers 20a and 20b (or the radiation thermometers 220, 320, and 520); the output parameter estimation part 35 for estimating the output parameter from the first and second input parameters; and the temperature calculation part 36 for calculating the temperature of the semiconductor wafer W from the output parameter estimated by the output parameter estimation part 35 and the brightness temperature detected by the first and second radiation thermometers 20*a* and 20*b* (or the radiation thermometers 220, 320, and 520). The output parameter estimation part 35 estimates the output parameter, based on the correlation between the first input parameter specified by the second input parameter and the output parameter.

The heat treatment apparatuses 160, 460, and 560 according to the first, fourth, and fifth preferred embodiments include the first and second radiation thermometers 20*a* and 20*b* with different angles α and β (or angles α2 and β2) between the respective paths of received light and the normal O to the back surface of the semiconductor wafer W.

According to such a configuration, the temperature of the semiconductor wafer W is accurately measured even if the emissivities are unknown.

Similar effects are produced even when other configurations exemplified in the present invention are added to the aforementioned configuration as appropriate, i.e. even when other configurations in the present invention which are not mentioned as the aforementioned configuration are added as appropriate.

Modifications of Aforementioned Preferred Embodiments

The material properties, materials, dimensions, shapes, and relative positional relationship of the components or conditions for implementation are described in some cases in the aforementioned preferred embodiments. These are, however, merely examples in all aspects and shall not be limited to those described in the present invention.

Thus, numerous unillustrative modifications and equivalents can be devised within the technical scope disclosed in the present invention. Examples of these shall include an instance where at least one component is modified, added or dispensed with and an instance where at least one component in at least one preferred embodiment is extracted and combined with a component in another preferred embodiment.

In the aforementioned preferred embodiments, the brightness temperature is used as the second input parameter, but the second input parameter is not limited to this. The second input parameter may be brightness.

The log ratio Ld between emissivities is used as the output parameter in the aforementioned preferred embodiments, but the output parameter is not limited to this. The output parameter may be a ratio between emissivities or the emissivities. The emissivities are expressed by Equations (6) and (7) to be described below.

$$\varepsilon_a = \exp\left\{\frac{C_2}{\lambda_1}\left(\frac{1}{T} - \frac{1}{S_a}\right)\right\} \quad (6)$$

$$\varepsilon_b = \exp\left\{\frac{C_2}{\lambda_2}\left(\frac{1}{T} - \frac{1}{S_b}\right)\right\} \quad (7)$$

In the aforementioned preferred embodiments, the first and second radiation thermometers 20*a* and 20*b* and the radiation thermometers 220, 320, and 520 have the configuration for detecting the brightness temperature of the semiconductor wafer W from obliquely below the semiconductor wafer W, but are not limited to this. The radiation thermometers may have a configuration for detecting the brightness temperature of the semiconductor wafer W from obliquely above the semiconductor wafer W.

In the aforementioned first and fourth preferred embodiments, the first and second radiation thermometers 20*a* and 20*b* have the configuration for detecting the two brightness temperatures that are detected when the angles α and β formed by the respective light paths Xa and Xb to be received and the normal O of the back surface of the semiconductor wafer W in different position from each other, but not limited to this. Three or more radiation thermometers may have a configuration for detecting signals different from each other.

In the aforementioned fourth preferred embodiment, the input parameter calculation part 34 further calculates the third input parameter corresponding to the temperature of the chamber 6, and the output parameter estimation step estimates the output parameter, based on the first input parameter, the second input parameter, and the third input parameter. The present invention, however, is not limited to this. The third input parameter may be the temperature of an atmosphere inside the chamber 6.

When referred to without being particularly specified in the aforementioned preferred embodiments, a material shall contain another additive, e.g. an alloy, so long as no inconsistencies arise.

While the invention has been described in detail, the foregoing description is in all aspects illustrative and not restrictive. It is understood that numerous other modifications and variations can be devised without departing from the scope of the invention.

What is claimed is:

1. A method of measuring a temperature of a substrate heated by irradiation with light, said method comprising the steps of:

(a) detecting at least one brightness temperature of said substrate by a first radiation thermometer and a second radiation thermometer from obliquely above or obliquely below said substrate;

(b) calculating at least two input parameters from said brightness temperature detected in said step (a), said at least two input parameters including a first input parameter corresponding to an emissivity ratio between a first emissivity of said first radiation thermometer and a second emissivity of said second radiation thermometer and a second input parameter corresponding to said brightness temperature of said substrate;

(c) estimating an output parameter from said first input parameter and said second input parameter, said output parameter being a ratio between a logarithm of said first emissivity and a logarithm of said second emissivity; and (d) calculating the temperature of said substrate from said output parameter estimated in said step (c) and said brightness temperature detected in said step (a), wherein said output parameter is estimated in said step (c), based on a correlation between said first input parameter and said output parameter, said correlation being specified as different according to said second input parameter.

2. The method according to claim 1, wherein an angle formed between a path of light received by said first radiation thermometer and a normal to a front or back surface of said substrate is different from an angle formed between a path of light received by said second radiation thermometer and a normal to a front or back surface of said substrate, and wherein a first brightness temperature is detected by said first radiation thermometer and a second brightness temperature is detected by said second radiation thermometer in said step (a).

3. The method according to claim 1,
wherein two different polarization components with the same angle between a path of received light and a normal to a front or back surface of said substrate are detected in said step (a).

4. The method according to claim 1,
wherein two different wavelength components with the same angle between a path of received light and a normal to a front or back surface of said substrate are detected in said step (a).

5. The method according to claim 1,
wherein said at least one brightness temperature of said substrate is detected from obliquely below said substrate in said step (a).

6. The method according to claim 1,
wherein said substrate is heated while being received in a chamber,
wherein a third input parameter corresponding to a temperature of said chamber is further calculated in said step (b), and
wherein said output parameter is estimated in said step (c), based on said first input parameter, said second input parameter, and said third input parameter.

7. A heat treatment apparatus for irradiating a substrate with light to heat the substrate, comprising:
a chamber for receiving said substrate therein;
a susceptor for placing and holding said substrate thereon within said chamber;
first radiation thermometer and a second radiation thermometer provided obliquely above or obliquely below said susceptor and for detecting a brightness temperature of said substrate;
an input parameter calculation part for calculating at least two input parameters from said brightness temperature detected by said first radiation thermometer and said second radiation thermometer, said at least two input parameters including a first input parameter corresponding to an emissivity ratio between a first emissivity of said first radiation thermometer and a second emissivity of said second radiation thermometer and a second input parameter corresponding to said brightness temperature of said substrate;
an output parameter estimation part for estimating an output parameter from said first input parameter and said second input parameter, said output parameter being a ratio between a logarithm of said first emissivity and a logarithm of said second emissivity; and
a temperature calculation part for calculating the temperature of said substrate from said output parameter estimated by said output parameter estimation part and said brightness temperature detected by said first radiation thermometer and said second radiation thermometer,
wherein said output parameter estimation part estimates said output parameter based on a correlation between said first input parameter and said output parameter, said correlation being specified as different according to said second input parameter.

8. The heat treatment apparatus according to claim 7,
wherein an angle formed between a path of light received by said first radiation thermometer and a normal to a front or back surface of said substrate is different from an angle formed between a path of light received by said second radiation thermometer and a normal to a front or back surface of said substrate.

* * * * *